(12) United States Patent
Liu et al.

(10) Patent No.: US 11,101,304 B2
(45) Date of Patent: Aug. 24, 2021

(54) DIODE AND FABRICATION METHOD THEREOF, ARRAY SUBSTRATE AND DISPLAY PANEL

(71) Applicant: Xiamen Tianma Micro-Electronics Co., Ltd., Xiamen (CN)

(72) Inventors: Bozhi Liu, Xiamen (CN); Xiaoqi Shi, Xiamen (CN); Shoujin Cai, Xiamen (CN); Xuexin Lan, Xiamen (CN); Guozhao Chen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/653,019

(22) Filed: Oct. 15, 2019

(65) Prior Publication Data
US 2020/0212081 A1 Jul. 2, 2020

(30) Foreign Application Priority Data

Dec. 27, 2018 (CN) .......................... 201811612490.5

(51) Int. Cl.
*H01L 27/146* (2006.01)
*G06K 9/00* (2006.01)
(Continued)

(52) U.S. Cl.
CPC ........ *H01L 27/1461* (2013.01); *G06K 9/0004* (2013.01); *G06K 9/00053* (2013.01);
(Continued)

(58) Field of Classification Search
CPC ........... H01L 27/1461; H01L 27/14603; H01L 27/14623; H01L 27/14678;
(Continued)

(56) References Cited

U.S. PATENT DOCUMENTS 4,784,702 A 11/1988 Henri
5,061,040 A * 10/1991 Yaniv .................... G02F 1/1365
349/50

(Continued)

FOREIGN PATENT DOCUMENTS

| CN | 101577285 A | 11/2009 |
| CN | 102800735 A | 11/2012 |
| CN | 105789226 A | 7/2016 |

*Primary Examiner* — Ahmed N Sefer
(74) *Attorney, Agent, or Firm* — Anova Law Group, PLLC

(57) ABSTRACT

A diode and its fabrication method are provided. The diode includes a substrate, a buffer layer on a side of the substrate, a first film layer, a second film layer and a third film layer. The first film layer is a polycrystalline silicon film layer; the second film layer is an amorphous silicon film layer; and the third film layer is one of the polycrystalline silicon film layer and the amorphous silicon film layer. The diode at least includes a first portion, a second portion, a third portion, a first electrode, and a second electrode. The first portion is located in the first film layer; the second portion is located in the second film layer; and the third portion is located in the third film layer. The first electrode is electrically connected to the first portion, and the second electrode is electrically connected to the third portion.

17 Claims, 20 Drawing Sheets

(51) Int. Cl.
*H01L 31/105* (2006.01)
*H01L 31/20* (2006.01)

(52) U.S. Cl.
CPC .... *G06K 9/00087* (2013.01); *H01L 27/14603* (2013.01); *H01L 27/14623* (2013.01); *H01L 27/14678* (2013.01); *H01L 27/14692* (2013.01); *H01L 31/1055* (2013.01); *H01L 31/202* (2013.01); *Y02P 70/50* (2015.11)

(58) Field of Classification Search
CPC .......... H01L 27/14692; H01L 31/1055; H01L 31/202; G06K 9/0004; G06K 9/00087; Y02P 70/50
See application file for complete search history.

(56) References Cited

U.S. PATENT DOCUMENTS

| | | | |
|---|---|---|---|
| 6,879,014 B2* | 4/2005 | Wagner | H01L 31/1872 257/458 |
| 2008/0197360 A1* | 8/2008 | Sriram | H01L 29/861 257/77 |
| 2008/0224143 A1* | 9/2008 | Kim | H01L 27/1229 257/59 |
| 2009/0162961 A1 | 6/2009 | Deane | |
| 2012/0153173 A1* | 6/2012 | Chang | H01L 27/14658 250/370.08 |
| 2012/0299070 A1* | 11/2012 | Yamada | H01L 27/14663 257/291 |
| 2015/0369661 A1* | 12/2015 | Lin | G06K 9/0004 250/227.11 |
| 2017/0092673 A1* | 3/2017 | Miyamoto | H01L 27/14609 |
| 2020/0259034 A1* | 8/2020 | Huang | H01L 27/1461 |

* cited by examiner

DIODE AND FABRICATION METHOD THEREOF, ARRAY SUBSTRATE AND DISPLAY PANEL

CROSS-REFERENCES TO RELATED APPLICATION

This application claims the priority of Chinese Patent Application No. 201811612490.5, filed on Dec. 27, 2018, the content of which is incorporated herein by reference in its entirety.

TECHNICAL FIELD

The present disclosure generally relates to the field of display technology and, more particularly, relates to a diode and its fabrication method, an array substrate, and a display panel.

BACKGROUND

With the continuous development of electronic technology, fingerprint recognition has been widely applied to the display screens of electronic devices, such as mobile phones, personal digital assistants, computers, etc. Embedding fingerprint recognition devices into the display regions, which is one of the research tops in the field of display technology, may save the front display areas of mobile phones or mobile devices and improve user experience. Before operating the display devices with the fingerprint recognition function, users may only need to touch the display devices with fingers to verify the authentication, which may simplify the authentication verification process. The existing display panels with the fingerprint recognition function may include a plurality of light-emitting units and a plurality of fingerprint sensing units. The fingerprint sensing units may perform the fingerprint re cognition according to the reflected light which is emitted from a light source and then reflected by a main touch part. Through the reflectivity differences between the fingerprint valleys and ridges, different fingerprint information received by the fingerprint sensing units may be implemented to be differentiated, thereby forming fingerprint images.

The existing optical fingerprint recognition technology may use photodiodes as the photo-sensing devices. A photodiode, same as a regular diode, is also a semiconductor device consisting of a PN junction, and also has unidirectional conductivity. However, the photodiode is not used as a rectifying element in a circuit; but converts an optical signal to an electrical signal. The regular diode may be cut-off when a reverse voltage is applied, and only a weak reverse current may flow. The photodiode may be operated in reverse voltage. The reverse current is extremely weak without illumination and is called dark current; and the reverse current rapidly increases to several tens of microamps with illumination and is called photocurrent. The greater the intensity of the light is, the greater the reverse current is. The light intensity change may cause the photodiode current to change, so the optical signal may be converted into the electrical signal and the photodiode may become a photoelectric sensing device.

However, in the existing technology, the photodiode fabricated based on a low-temperature poly-silicon (LTPS) process may use a horizontal-type positive-intrinsic-negative (PIN) structure or may directly implement the photodetector function by utilizing the leakage current sensitivity to light of a transistor. The photosensitivity of poly-silicon may be one order of magnitude lower than the photosensitivity of amorphous silicon, and the photo-sensing layer of the horizontal-type PIN structure may not be fabricated to have sufficient thickness to absorb the light entering the fingerprint recognition units, so the fingerprint recognition units have poor photosensitivity and a strong light source may be required to improve the photosensitivity. However, the power consumption may be increased by using the strong light source, which may limit the practical availability of the horizontal-type PIN structure based on the LTPS process.

There is a need to provide a diode and its fabrication method, an array substrate, and a display panel, which have desirable diode characteristics, high photocurrent sensitivity to luminous intensity, high practical availability and improved fingerprint recognition capability.

SUMMARY

One aspect of the present disclosure provides a diode. The diode includes a substrate, a buffer layer on a side of the substrate, and a first film layer, a second film layer and a third film layer which are configured at a side of the buffer layer away from the substrate. The second film layer is located at a side of the first film layer away from the buffer layer, and the third film layer is located at a side of the second film layer away from the buffer layer. The first film layer is a polycrystalline silicon film layer; the second film layer is an amorphous silicon film layer; and the third film layer is one of the polycrystalline silicon film layer and the amorphous silicon film layer. The diode at least includes a first portion, a second portion, a third portion, a first electrode, and a second electrode. The first portion is located in the first film layer; the second portion is located in the second film layer; and the third portion is located in the third film layer. The first electrode is located at a side of the first portion away from the buffer layer and is electrically connected to the first portion; and the second electrode is located at a side of the third portion away from the buffer layer and is electrically connected to the third portion.

Another aspect of the present disclosure provides a method for fabricating the diode. The method includes after forming a buffer layer on a substrate and a first layer of intrinsic amorphous silicon above the buffer layer, forming intrinsic polycrystalline silicon from the intrinsic amorphous silicon through crystallization; forming a first film layer of N-type polycrystalline silicon or P-type polycrystalline silicon from the intrinsic polycrystalline silicon by doping ions; forming a first portion of the diode by patterning the first film layer; after forming a first insulation layer, forming a first via in the first insulation layer over a surface portion of the first portion; forming a second portion of the diode in the first via, the second portion of the diode including a portion of intrinsic amorphous silicon; forming a third portion of the diode in the first via over the second portion, the third portion of the diode including P-type silicon or N-type silicon by doping ions in another portion of the intrinsic amorphous silicon in the first via; forming a second via by patterning the first insulation layer; and forming a metal layer and then forming a first electrode and a second electrode by patterning the metal layer, such that the first electrode is electrically connected to the first portion through the second via, and the second electrode is electrically connected to the third portion.

Another aspect of the present disclosure provides an array substrate, including the above-mentioned diode. The diode includes a substrate, a buffer layer on a side of the substrate, and a first film layer, a second film layer and a third film layer which are configured at a side of the buffer layer away from the substrate. The second film layer is located at a side of the first film layer away from the buffer layer, and the third film layer is located at a side of the second film layer away from the buffer layer. The first film layer is a polycrystalline silicon film layer; the second film layer is an amorphous silicon film layer; and the third film layer is one of the polycrystalline silicon film layer and the amorphous silicon film layer. The diode at least includes a first portion, a second portion, a third portion, a first electrode, and a second electrode. The first portion is located in the first film layer; the second portion is located in the second film layer; and the third portion is located in the third film layer. The first electrode is located at a side of the first portion away from the buffer layer and is electrically connected to the first portion; and the second electrode is located at a side of the third portion away from the buffer layer and is electrically connected to the third portion.

Another aspect of the present disclosure provides a display panel, including the above-mentioned array substrate which includes the above-mentioned diode. The diode includes a substrate, a buffer layer on a side of the substrate, and a first film layer, a second film layer and a third film layer which are configured at a side of the buffer layer away from the substrate. The second film layer is located at a side of the first film layer away from the buffer layer, and the third film layer is located at a side of the second film layer away from the buffer layer. The first film layer is a polycrystalline silicon film layer; the second film layer is an amorphous silicon film layer; and the third film layer is one of the polycrystalline silicon film layer and the amorphous silicon film layer. The diode at least includes a first portion, a second portion, a third portion, a first electrode, and a second electrode. The first portion is located in the first film layer; the second portion is located in the second film layer; and the third portion is located in the third film layer. The first electrode is located at a side of the first portion away from the buffer layer and is electrically connected to the first portion; and the second electrode is located at a side of the third portion away from the buffer layer and is electrically connected to the third portion.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
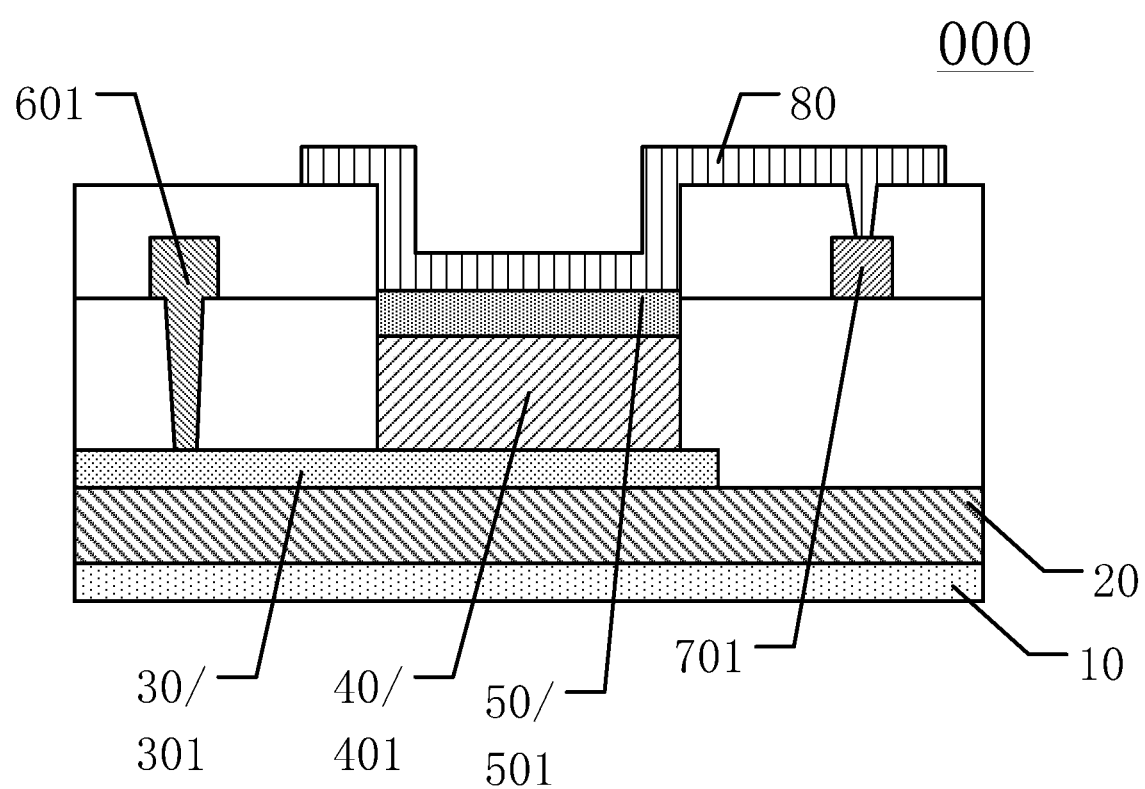
FIG. 1 illustrates a cross-sectional structural schematic of a diode according to embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Various exemplary embodiments of the present disclosure will be described in detail with reference to the drawings. It should be noted that the relative arrangements of components and steps, numerical expressions and numerical values set forth in the embodiments are not intended to limit the scope of the present disclosure unless otherwise specified.

The following description of at least one exemplary embodiment is merely illustrative, and not as any limitations on the present disclosure and its application or use.

Techniques, methods and instruments known to those skilled in the art may not be discussed in detail, but where appropriate, the techniques, methods and instruments should be considered as part of the specification.

In all of the examples illustrated and discussed herein, any specific values should be construed as merely illustrative, and not as a limitation. Thus, other examples of the exemplary embodiments may have different values.

It should be noted that similar reference numerals and letters refer to similar items in the following figures, and therefore, once an item is defined in a figure, it is not required to be further discussed in the subsequent figures.

Referring to FIG. 1, FIG. 1 illustrates a cross-sectional structural schematic of a diode according to embodiments of the present disclosure. A diode may be provided in one embodiment. Optionally, the diode may be a photodiode, and the light intensity change may cause the current change of the photodiode, so an optical signal may be converted into an electrical signal, and the photodiode may be used as a photoelectric sensing device. A diode 000 in one embodiment may include a substrate 10, a buffer layer 20 on a side of the substrate 10, and a first film layer 30, a second film layer 40 and a third film layer 50 which are on a side of the buffer layer 20 away from the substrate 10. The second film layer 40 may be on a side of the first film layer 30 away from the buffer layer 20, and the third film layer 50 may be on a side of the second film layer 40 away from the buffer layer 20.

The first film layer 30 may be a polycrystalline silicon film layer. The second film layer 40 may be an amorphous silicon film layer. The third film layer 50 may be any of the polycrystalline silicon film layer and the amorphous silicon film layer.

The diode 000 may at least include a first portion 301, a second portion 401, a third portion 501, a first electrode 601 and a second electrode 701. The first portion 301 may be in the first film layer 30; the second portion 401 may be in the second film layer 40; and the third portion 501 may be in the third film layer 50.

The first electrode 601 may be on a side of the first portion 301 away from the buffer layer 20 and may be electrically connected to the first portion 301. The second electrode 701 may be on a side of the third portion 501 away from the buffer layer 20 and may be electrically connected to the third portion 501.

For example, the structure of the diode 000 in one embodiment may be a stacked photodiode structure fabricated by the LTPS process, where the first portion 301, the second portion 401, and the third portion 501 of the diode 00 may form a PIN (positive-intrinsic-negative) structure or a NIP (negative-intrinsic-positive) structure, respectively; and the first electrode 601 and the second electrode 701 may be a cathode and an anode of the diode 000, respectively. The sensitivity of the photodiode with the PIN structure or the NIP structure may be higher than the sensitivity of the regular photodiode with a PN junction. The first portion 301 may be in the first film layer 30; the second portion 401 may be in the second film layer 40; and the third portion 501 may be in the third film layer 50. In addition, the first film layer 30 may be a polycrystalline silicon film layer; the second film layer 40 may be an amorphous silicon film layer; and the third film layer 50 may be any of the polycrystalline silicon film layer and the amorphous silicon film layer. Therefore, the first portion 301 may be made of polycrystalline silicon (p-Si), the second portion 401 may be made of amorphous silicon (α-Si), and the third portion 501 may be made of polycrystalline silicon or amorphous silicon, thereby forming the photodiode structure by mixing and stacking polycrystalline silicon or amorphous silicon. The first portion 301, made of polycrystalline silicon, may be used as a negative layer or a positive layer. In addition, the first portion 301 may be electrically connected to the first electrode 601, so the first portion 301 may be used as a conductive layer to lead out the photogenerated charges from the photodiode during the illumination, thereby implementing the photo-sensing detection by detecting the led-out photogenerated charges. The second portion 401, made of amorphous silicon, may be used as a photosensitive layer. The photosensitivity of amorphous silicon may be one order of magnitude higher than the photosensitivity of polycrystalline silicon, that is, amorphous silicon may have desirable photosensitive characteristics, so the light absorption by the photodiode may be ensured to implement the desirable photo-sensing performance of the photodiode. However, the third portion 501 may be made of polycrystalline silicon or amorphous silicon, which may not be limited according to the embodiments of the present disclosure; and the third portion 501 may be designed according to actual requirements during the implementation. In one embodiment, the stacked photodiode structure fabricated by the LTPS process may make the diode 000 have desirable diode characteristics and also ensure the light absorption by the diode 000. In addition, the stacked structure (since the thickness of the intrinsic layer in the PIN structure is an important structural parameter of the degree of the light absorption, the thickness of the intrinsic layer may be larger to improve the response speed and sensitivity) may be utilized to fabricate the PIN structure of the diode 000 with an enough thickness to sufficiently absorb the light entering the diode 000, which may increase the luminous flux without a strong light source, increase the photosensitivity of the diode 000 and further reduce the power consumption of the light source.

It should be noted that, in one embodiment, the first portion 301 may be made of polycrystalline silicon, the second portion 401 may be made of amorphous silicon, and the third portion 501 may be made of polycrystalline silicon or amorphous silicon. However, in one embodiment, the first portion 301 may not be limited to N-type polycrystalline silicon or P-type polycrystalline silicon according to the embodiments of the present disclosure; and the third portion 501 may not be limited to N-type polycrystalline silicon, P-type polycrystalline silicon, N-type amorphous silicon, or P-type amorphous silicon according to the embodiments of the present disclosure, which may be designed according to actual requirements during the implementation. In one embodiment, the film layer structure of the diode 000 may not be limited the substrate 10, the buffer layer 20, the first film layer 30, the second film layer 40 and the third film layer 50 according to the embodiments of the present disclosure, and may further include other film layer structures (e.g., each insulating layer, and the like, which may not be filled in FIG. 1), which may not be described in detail herein.

It should be further noted that, in one embodiment, the first portion 301 may be electrically connected to the first electrode 601, and the third portion 501 may be electrically connected to the second electrode 701. The electrical connection method may be implemented through vias or other conductive film layers (e.g., a conductive layer 80 in FIG. 1), which may not be limited to the above-mentioned electrical connection method; and any other electrical connection methods may be included in the present disclosure, which may not be described in detail herein.

Figure 2:
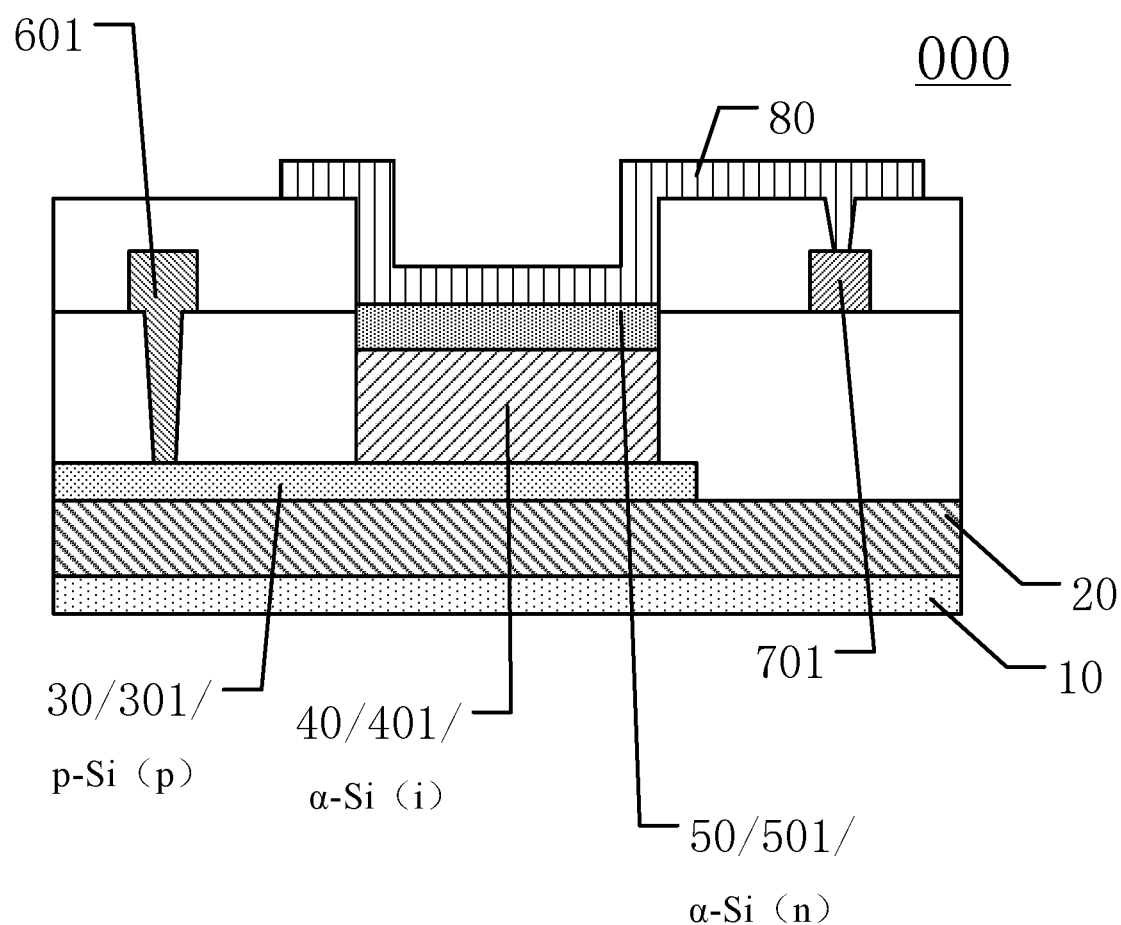
FIG. 2 illustrates a cross-sectional structural schematic of another diode according to embodiments of the present disclosure.
Figure 3:
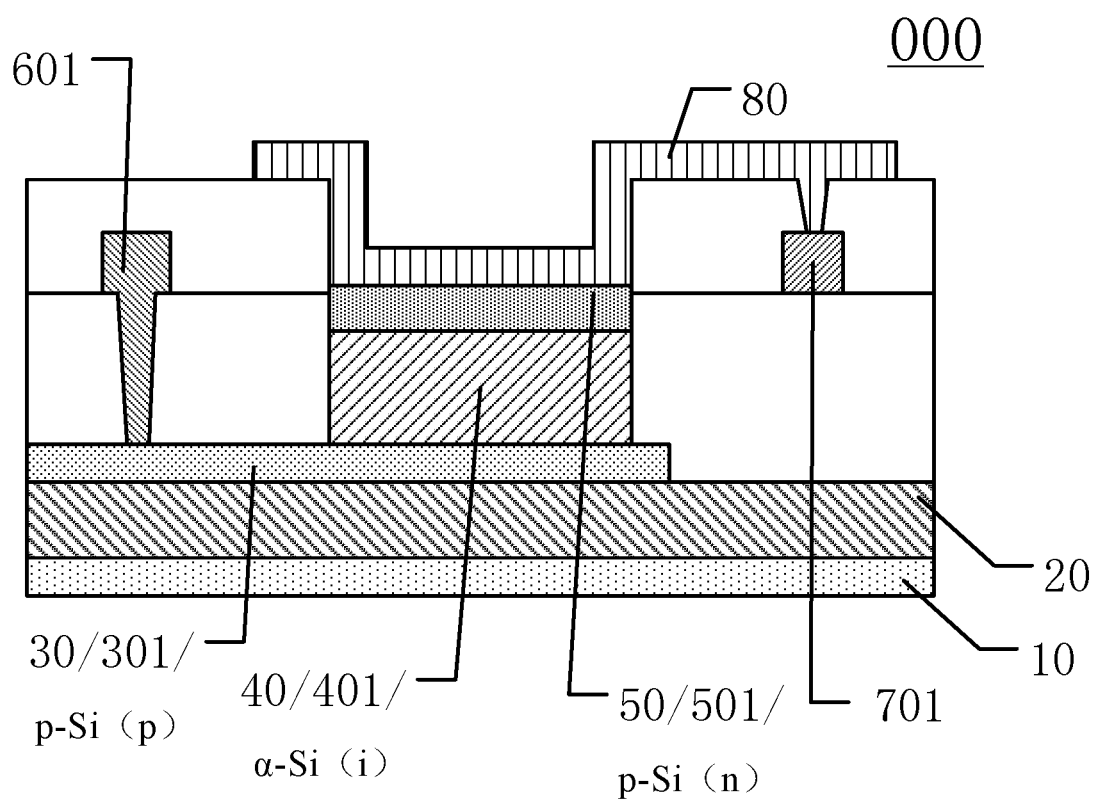
FIG. 3 illustrates a cross-sectional structural schematic of another diode according to embodiments of the present disclosure.

In some optional embodiments, referring to FIG. 2 and FIG. 3, FIG. 2 illustrates a cross-sectional structural schematic of another diode according to embodiments of the present disclosure; and FIG. 3 illustrates a cross-sectional structural schematic of another diode according to embodiments of the present disclosure. In one embodiment, the first film layer 30 may be P-type polycrystalline silicon, and the second film layer 40 may be intrinsic amorphous silicon; and the third film layer 50 may be any of N-type amorphous silicon or N-type polycrystalline silicon.

In one embodiment, it may further define that the first film layer 30 may be P-type polycrystalline silicon, the second film layer 40 may be intrinsic amorphous silicon, and the third film layer 50 may be one of N-type amorphous silicon and N-type polycrystalline silicon. That is, for the diode 000, the first portion 301 may be P-type polycrystalline silicon (indicated by p-Si (p) in FIG. 2); the second portion 401 may be intrinsic amorphous silicon (indicated by α-Si(i) in FIG. 2); and the third portion 501 may be N-type amorphous silicon (indicated by α-Si(n) in FIG. 2), which may not be described in detail in the following. Or, for the diode 000, the first portion 301 may be P-type polycrystalline silicon; the second portion 401 may be intrinsic amorphous silicon; and the third portion 501 may be N-type polycrystalline silicon (shown in FIG. 3). Currently, the portion of the diode 000 between the first electrode 601 and the second electrode 701 may be the PIN structure. The first electrode 601 may be electrically connected to the first portion 301, so the first electrode may be an anode, which is connected to a negative potential. The second electrode 701 may be electrically connected to the third portion 501, so the second electrode 701 may be a cathode, which is connected to a positive potential. Therefore, the diode 000 with the PIN structure may have desirable diode characteristics and operate under a reverse bias voltage (the cathode connected to the positive potential and the anode connected to the negative potential). When the diode 000 is under different illuminous intensities, the reverse photocurrent may have good responsiveness to illuminous intensities, thereby improving the photosensitivity and photo-sensing capability of the photodiode 000.

Figure 4:
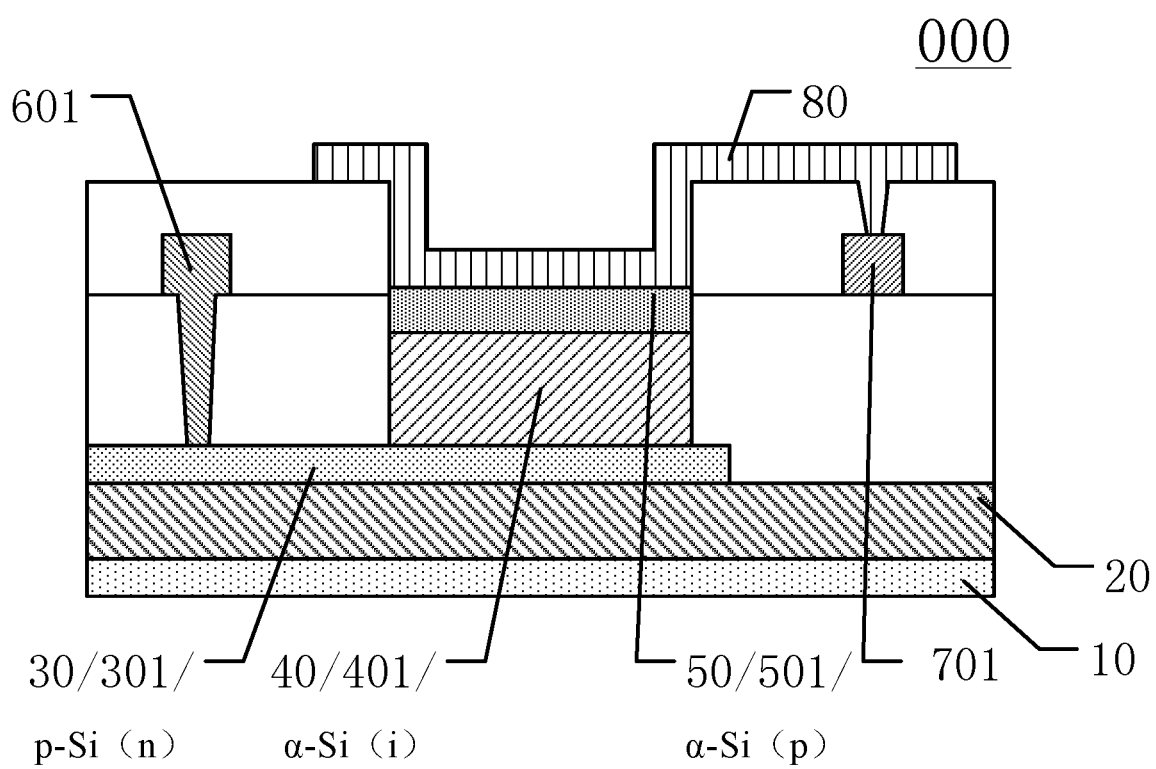
FIG. 4 illustrates a cross-sectional structural schematic of another diode according to embodiments of the present disclosure.
Figure 5:
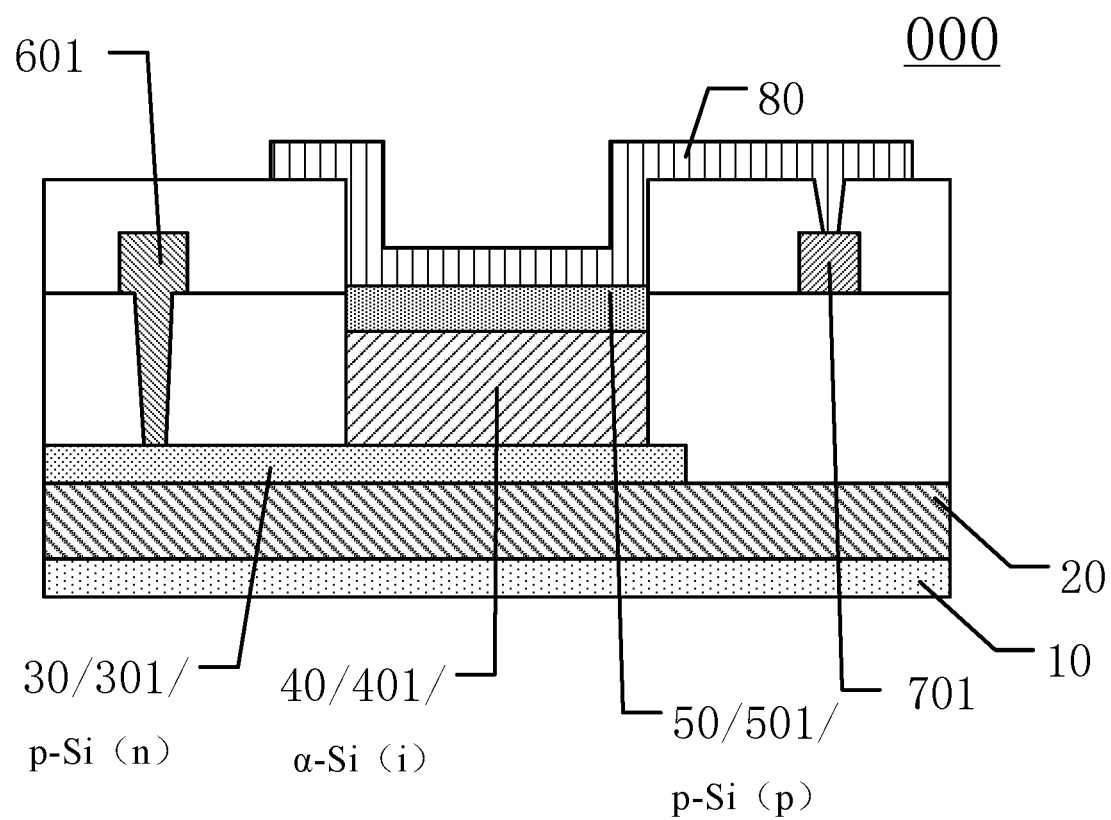
FIG. 5 illustrates a cross-sectional structural schematic of another diode according to embodiments of the present disclosure.

In some optional embodiments, referring to FIG. 4 and FIG. 5, FIG. 4 illustrates a cross-sectional structural schematic of another diode according to embodiments of the present disclosure; and FIG. 5 illustrates a cross-sectional structural schematic of another diode according to embodiments of the present disclosure. In one embodiment, the first film layer 30 may be N-type polycrystalline silicon, and the second film layer 40 may be intrinsic amorphous silicon; and the third film layer 50 may be one of P-type amorphous silicon and P-type polycrystalline silicon.

In one embodiment, it may further define that the first film layer 30 may be N-type polycrystalline silicon, the second film layer 40 may be intrinsic amorphous silicon, and the third film layer 50 may be one of P-type amorphous silicon and P-type polycrystalline silicon. The portion of the diode 000 between the first electrode 601 and the second electrode 701 may be the NIP structure, so the first film layer 30 may be N-type polycrystalline silicon, the second film layer 40 may be intrinsic amorphous silicon, and the third film layer 50 may be one of P-type amorphous silicon and P-type polycrystalline silicon. That is, for the diode 000, the first portion 301 may be N-type polycrystalline silicon; the second portion 401 may be intrinsic amorphous silicon; and the third portion 501 may be P-type amorphous silicon (shown in FIG. 4). Or, for the diode 000, the first portion 301 may be N-type polycrystalline silicon; the second portion 401 may be intrinsic amorphous silicon; and the third portion 501 may be P-type polycrystalline silicon (shown in FIG. 5). Currently, the first electrode 601 may be electrically connected to the first portion 301, so the first electrode may be a cathode, which is connected to a positive potential. The second electrode 701 may be electrically connected to the third portion 501, so the second electrode 701 may be an anode, which is connected to a negative potential. Therefore, the diode 000 with the NIP structure may also have desirable diode characteristics and operate under a reverse bias voltage (the cathode connected to the positive potential and the anode connected to the negative potential). When the diode 000 is under different illuminous intensities, the reverse photocurrent may have good responsiveness to illuminous intensities, thereby improving the photosensitivity and photo-sensing capability of the photodiode 000.

Figure 6:
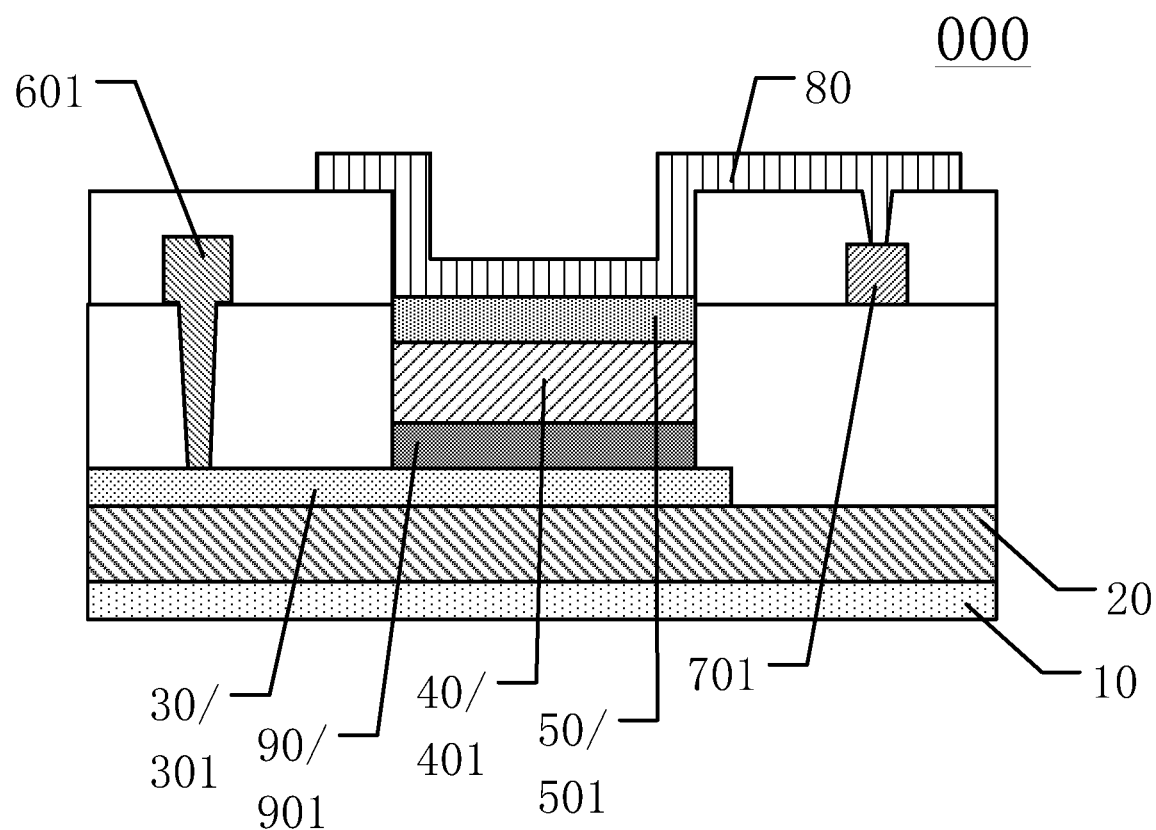
FIG. 6 illustrates a cross-sectional structural schematic of another diode according to embodiments of the present disclosure.

In some optional embodiments, referring to FIG. 6, FIG. 6 illustrates a cross-sectional structural schematic of another diode according to embodiments of the present disclosure. In one embodiment, a fourth film layer 90 may be configured at a side of the buffer layer 20 away from the substrate 10. The fourth film layer 90 may be between the first film layer 30 and the second film layer 40. The fourth film layer 90 may be an amorphous silicon film layer. The diode 000 may further include a fourth portion 901 which is in the fourth film layer 90.

In one embodiment, it may further illustrate that the diode 000 may further include the fourth film layer 90 between the first film layer 30 and the second film layer 40; the fourth film layer 90 may be the same amorphous silicon film layer as the second film layer 40; and the fourth portion 901 of the diode 000 may be in the fourth film layer 90, that is, the fourth portion 901 of the diode 000 may be amorphous silicon. The structure of the diode 000 in one embodiment may be the stacked photodiode structure fabricated by the LTPS process, where the first portion 301, the second portion 401, the third portion 501 and the fourth portion 901 of the diode 00 may form a PINN (positive-intrinsic-negative-negative) structure or a NIPP (negative-intrinsic-positive-positive) structure, respectively; and the first electrode 601 and the second electrode 701 may be a cathode and an anode of the diode 000, respectively. The first portion 301 may be in the first film layer 30; the second portion 401 may be in the second film layer 40; the third portion 501 may be in the third film layer 50; and the fourth portion 901 may be in the fourth film layer 90. In addition, the first film layer 30 may be a polycrystalline silicon film layer; the second film layer 40 may be an amorphous silicon film layer; the third film layer 50 may be one of the polycrystalline silicon film layer and the amorphous silicon film layer; and the fourth film layer 90 may be an amorphous silicon film layer. Therefore, the first portion 301 may be made of polycrystalline silicon (p-Si), the second portion 401 may be made of amorphous silicon (α-Si), the third portion 501 may be made of polycrystalline silicon or amorphous silicon, and the fourth portion 901 may be made of amorphous silicon (α-Si), thereby forming the photodiode structure by mixing and stacking polycrystalline silicon or amorphous silicon. The first portion 301, made of polycrystalline silicon, may be used as a negative layer or a positive layer. In addition, the first portion 301 may be electrically connected to the first electrode 601, so the first portion 301 may be used as a conductive layer to lead out photogenerated charges from the photodiode during the illumination, thereby implementing the photo-sensing detection by detecting the led-out photogenerated charges. The second portion 401 and the fourth portion 901, made of amorphous silicon, may be used as a photosensitive layer. The photosensitivity of amorphous silicon may be one order of magnitude higher than the photosensitivity of polycrystalline silicon, that is, amorphous silicon may have desirable photosensitive characteristics. Therefore, the light absorption by the photodiode may be ensured to implement the desirable photo-sensing performance of the photodiode; and the photo-sensing layer thickness of the diode 000 may be further increased, which may further improve the light absorption ability and photosensitivity of the diode. However, the third portion 501 may be made of polycrystalline silicon or amorphous silicon, which may not be limited according to the embodiments of the present disclosure; and the third portion 501 may be designed according to actual requirements during the implementation. In one embodiment, the stacked photodiode structure fabricated by the LTPS process may make the diode 000 have desirable diode characteristics and also ensure the light absorption by the diode 000. In addition, the two-layer amorphous silicon stacked structure of the second portion 401 and the fourth portion 901 may be utilized to further increase the photo-sensing layer thickness of the diode, thereby further sufficiently absorbing the light entering the diode 000 and improving the photosensitivity of the diode 000.

It should be noted that, in one embodiment, the first portion 301 may be made of polycrystalline silicon, the second portion 401 may be made of amorphous silicon, the third portion 501 may be made of polycrystalline silicon or amorphous silicon, and the fourth portion 901 may be made of amorphous silicon. However, in one embodiment, the first portion 301 may not be limited to N-type polycrystalline silicon or P-type polycrystalline silicon according to the embodiments of the present disclosure; the third portion 501 may not be limited to N-type polycrystalline silicon, P-type polycrystalline silicon, N-type amorphous silicon, or P-type amorphous silicon according to the embodiments of the present disclosure; and the fourth portion 901 may not be limited to N-type amorphous silicon, or P-type amorphous silicon according to the embodiments of the present disclosure, which may be designed according to actual requirements during the implementation.

Figure 7:
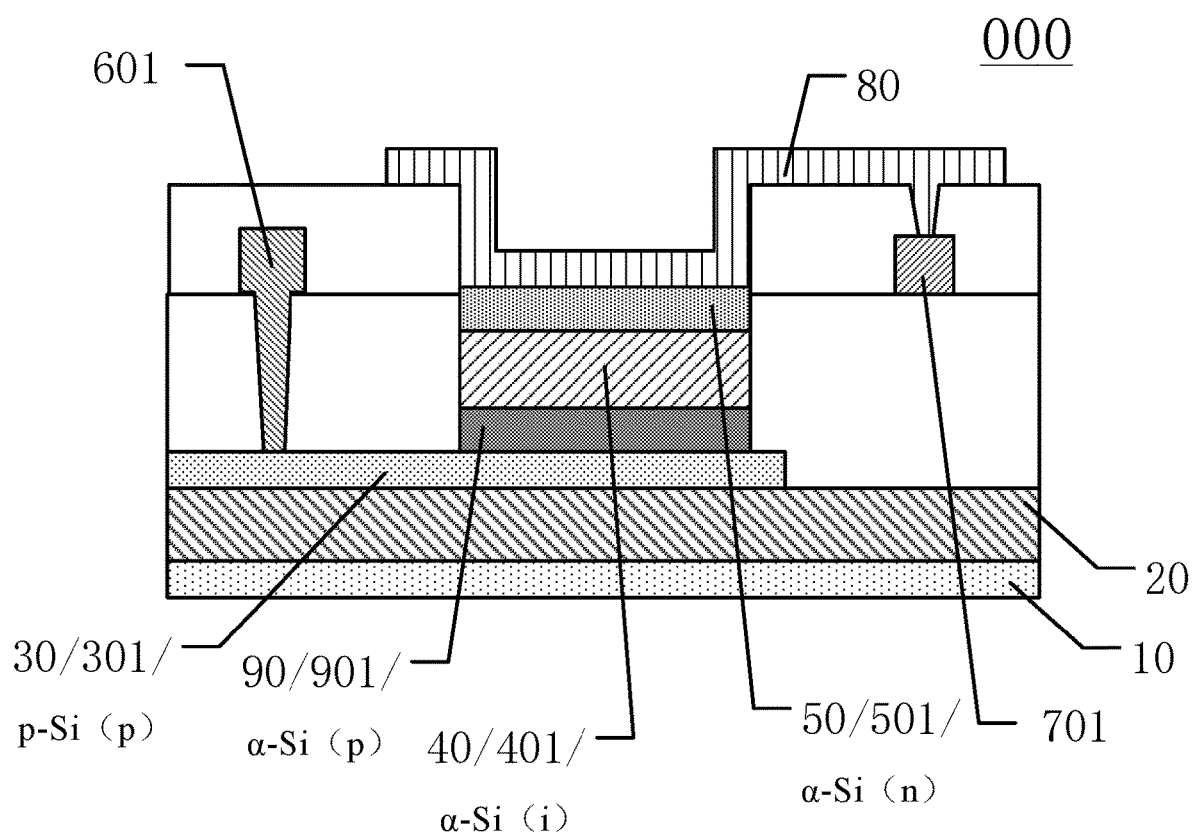
FIG. 7 illustrates a cross-sectional structural schematic of another diode according to embodiments of the present disclosure.
Figure 8:
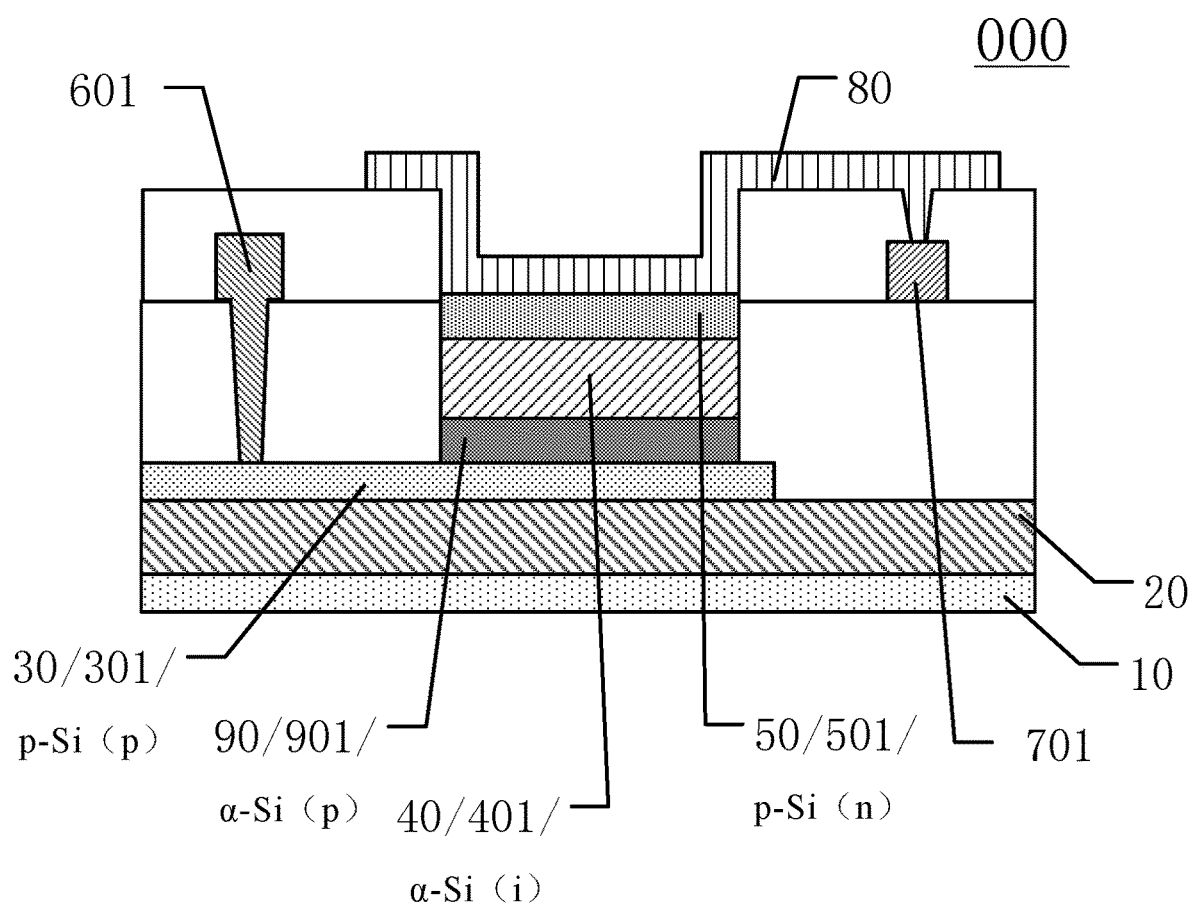
FIG. 8 illustrates a cross-sectional structural schematic of another diode according to embodiments of the present disclosure.
Figure 9:
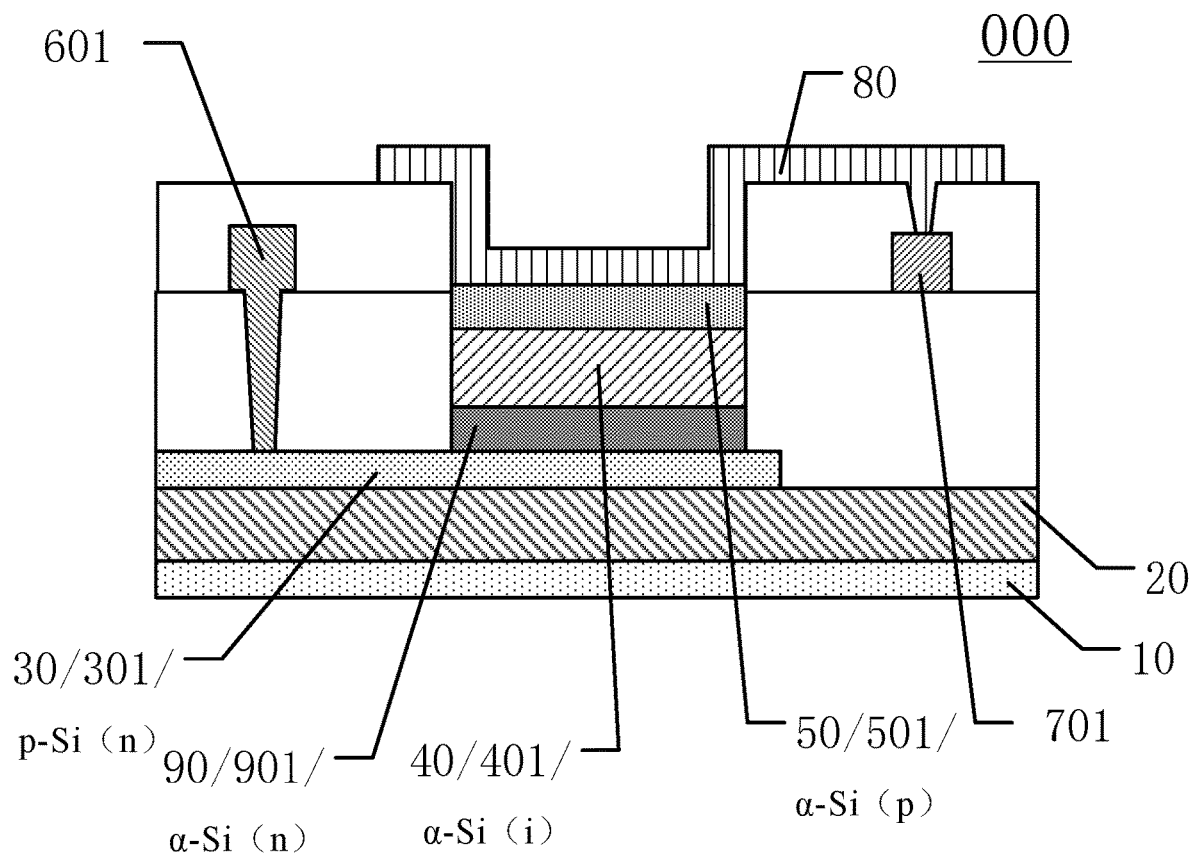
FIG. 9 illustrates a cross-sectional structural schematic of another diode according to embodiments of the present disclosure.
Figure 10:
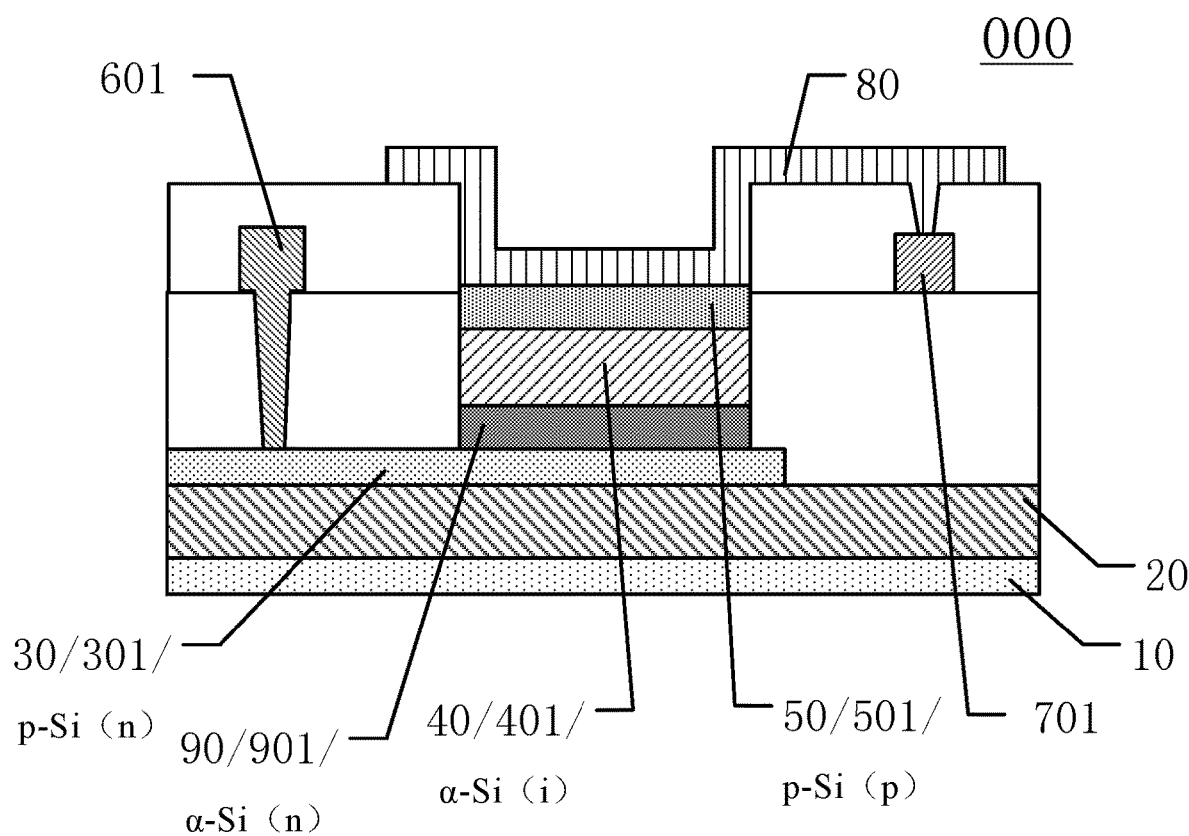
FIG. 10 illustrates a cross-sectional structural schematic of another diode according to embodiments of the present disclosure.

Referring to FIGS. 7-10, FIG. 7 illustrates a cross-sectional structural schematic of another diode according to embodiments of the present disclosure; FIG. 8 illustrates a cross-sectional structural schematic of another diode according to embodiments of the present disclosure; FIG. 9 illustrates a cross-sectional structural schematic of another diode according to embodiments of the present disclosure; and FIG. 10 illustrates a cross-sectional structural schematic of another diode according to embodiments of the present disclosure. In one embodiment, the fourth film layer 90 is one of N-type amorphous silicon or P-type amorphous silicon.

In one embodiment, it may further define that the fourth film layer 90 is one of N-type amorphous silicon and P-type amorphous silicon, that is, the fourth film layer 90 may be N-type amorphous silicon and may also be P-type amorphous silicon.

That is, for the diode 000, the first portion 301 may be P-type polycrystalline silicon; the fourth portion 901 may be P-type amorphous silicon; the second portion 401 may be intrinsic amorphous silicon; and the third portion 501 may be N-type amorphous silicon (shown in FIG. 7). The portion of the diode 000 between the first electrode 601 and the second electrode 701 may be the NIPP structure. Currently, the first electrode 601 may be an anode connected to a negative potential, and the second electrode 701 may be a cathode connected to a positive potential. Or, for the diode 000, the first portion 301 may be P-type polycrystalline silicon; the fourth portion 901 may be P-type amorphous silicon; the second portion 401 may be intrinsic amorphous silicon; and the third portion 501 may be N-type polycrystalline silicon (shown in FIG. 8). The portion of the diode 000 between the first electrode 601 and the second electrode 701 may be the NIPP structure. Currently, the first electrode 601 may be an anode connected to a negative potential, and the second electrode 701 may be a cathode connected to a positive potential.

The portion of the diode 000 between the first electrode 601 and the second electrode 701 may also be the PINN structure. Therefore, for the diode 000, the first portion 301 may be N-type polycrystalline silicon; the fourth portion 901 may be N-type amorphous silicon; the second portion 401 may be intrinsic amorphous silicon; and the third portion 501 may be P-type amorphous silicon (shown in FIG. 9). Currently, the first electrode 601 may be a cathode connected to a positive potential, and the second electrode 701 may be an anode connected to a negative potential. Or, for the diode 000, the first portion 301 may be N-type polycrystalline silicon; the fourth portion 901 may be N-type amorphous silicon; the second portion 401 may be intrinsic amorphous silicon; and the third portion 501 may be P-type polycrystalline silicon (shown in FIG. 10). Currently, the first electrode 601 may be a cathode connected to a positive potential, and the second electrode 701 may be an anode connected to a negative potential.

In one embodiment, the two-layer amorphous silicon stacked structure of the second portion 401 and the fourth portion 901 of the diode 000 may be utilized to further increase the photo-sensing layer thickness of the diode 000, thereby further sufficiently absorbing the light entering the diode 000 and improving the photosensitivity of the diode 000. In addition, the stacked structure may make the diode 000 to have desirable diode characteristics and operate under a reverse bias voltage (the cathode connected to the positive potential and the anode connected to the negative potential). When the diode 000 is under different illuminous intensities, the reverse photocurrent may have good responsiveness to illuminous intensities, thereby improving the photosensitivity and photo-sensing capability of the diode 000.

In some optional embodiments, referring to FIG. 1 and FIG. 6, the transparent conductive layer 80 may also be configured at a side of the third film layer 50 away from the substrate 10, and the third portion 501 may be electrically connected to the second electrode 701 through the transparent conductive layer 80.

In one embodiment, it may further illustrate that the third portion 501 may be electrically connected to the second electrode 701 through the transparent conductive layer 80, and the transparent conductive layer 80 may be on the side of the third film layer 50 away from the substrate 10. For example, one side of the transparent conductive layer 80 may be further electrically connected to the second electrode 701 through a via after attaching to the third portion 501, thereby implementing the electrical connection between the third portion 501 and the second electrode 701. The transparent conductive layer 80 may also be electrically connect the third portion 501 to the second electrode 701 without affecting the amount of light sensed by the second portion 401 of the second film layer 40, simultaneously, thereby transmitting the light signal generated by the diode 000 due to illumination to the second electrode 701 through the transparent conductive layer 80, and implementing the photo-sensing detection of the diode 000.

It should be noted that, in one embodiment, the material of the transparent conductive layer 80 may not be limited according to the embodiments of the present disclosure, which may be any of indium tin oxides (ITO) or antimony doped tin dioxide (ATO). The material of the transparent conductive layer 80 may also be other suitable transparent conductive material(s), which may be required to make the transparent conductive layer to be conductive and transparent; and may not be described in detail herein.

Figure 11:
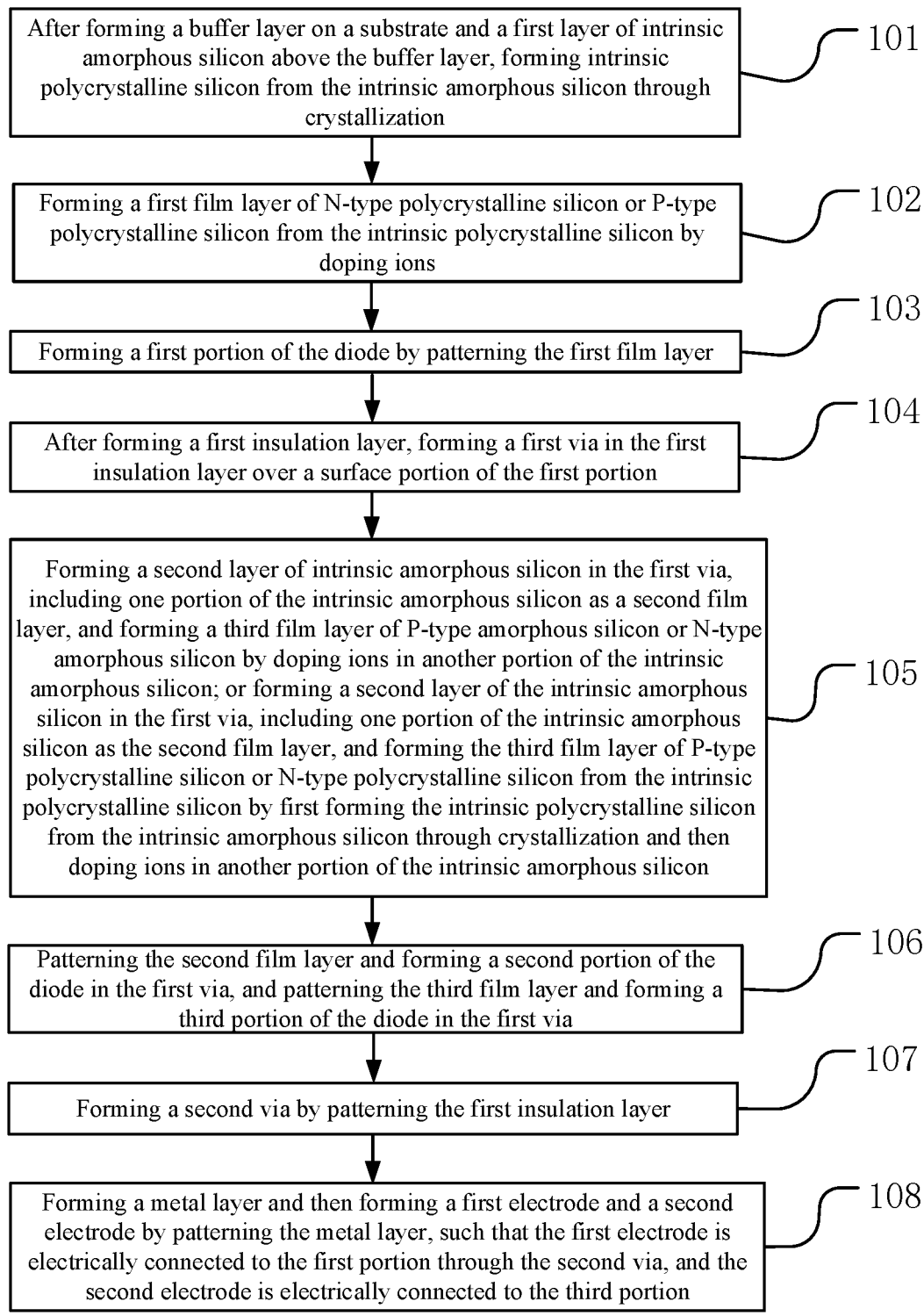
FIG. 11 illustrates a flow chart of a method for fabricating a diode according to embodiments of the present disclosure.

In some optional embodiments, referring to FIG. 11, FIG. 11 illustrates a flow chart of a method for fabricating a diode according to embodiments of the present disclosure. The method for fabricating the diode provided in one embodiment may include:

step 101, forming the intrinsic polycrystalline silicon from the intrinsic amorphous silicon through crystallization after depositing one buffer layer and one layer of the intrinsic amorphous silicon on the substrate;

step 102, forming the first film layer 30 of N-type polycrystalline silicon or P-type polycrystalline silicon from the intrinsic polycrystalline silicon by doping ions;

step 103, forming the first portion of the diode by patterning the first film layer;

step 104, after depositing one first insulation layer, forming a first via by patterning the first insulation layer;

step 105, after depositing one layer of the intrinsic amorphous silicon, using one portion of the intrinsic amorphous silicon as the second film layer, and forming the third film layer of P-type amorphous silicon or N-type amorphous silicon by doping ions in another portion of the intrinsic amorphous silicon; or after depositing one layer of the intrinsic amorphous silicon, using one portion of the intrinsic amorphous silicon as the second film layer, and forming the third film layer of P-type polycrystalline silicon or N-type polycrystalline silicon from the intrinsic polycrystalline silicon by first forming the intrinsic polycrystalline silicon from the intrinsic amorphous silicon through crystallization and then doping ions in another portion of the intrinsic amorphous silicon;

step 106, patterning the second film layer and forming the second portion of the diode in the first via, and patterning the third film layer and forming the third portion of the diode in the first via;

step 107, forming a second via by patterning the first insulation layer; and step 108, depositing one metal layer, and then forming the first electrode and the second electrode by patterning the metal layer, such that the first electrode may be electrically connected to the first portion through the second via, and the second electrode may be electrically connected to the third portion.

For example, referring to FIGS. 12-18, FIGS. 12-18 illustrate cross-sectional structural schematics of a method for fabricating a diode in FIG. 11. The method for fabricating the diode provided in one embodiment may be described as the following.

Figure 12:
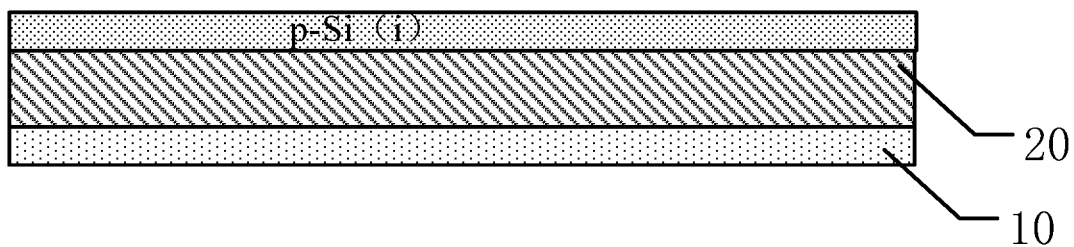
FIGS. 12-18 illustrate cross-sectional structural schematics of a method for fabricating a diode in FIG. 11.

As shown in FIG. 12, after depositing one buffer layer 20 and one layer of the intrinsic amorphous silicon (e.g., i-type α-Si) with a thickness of about 40 nm to about 60 nm on the substrate 10, the intrinsic amorphous silicon (e.g., i-type α-Si) may be converted to the intrinsic polycrystalline silicon (e.g., i-type p-Si) by the excimer laser crystallization (that is, the excimer laser annealing ELA, where the amorphous silicon may be irradiated by an excimer laser, thereby converting the amorphous silicon to the polycrystalline silicon) or the solid phase crystallization (SPC).

Figure 13:
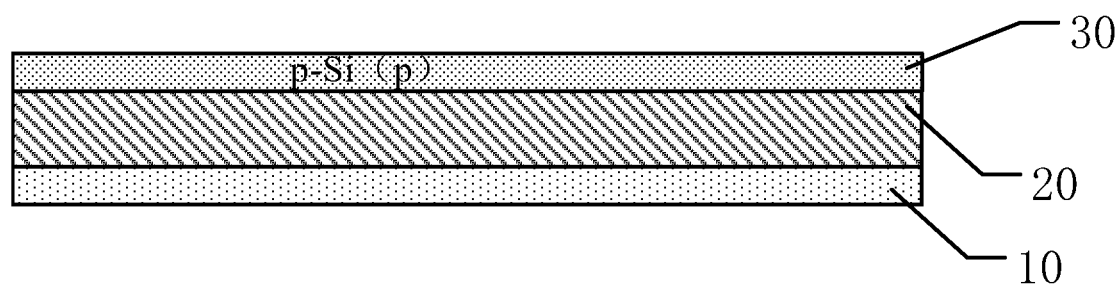

As shown in FIG. 13, the first film layer 30 of P-type polycrystalline (P-type p-Si) may be formed from the intrinsic polycrystalline silicon (e.g., i-type p-Si) by doping boron ions or indium ions.

Figure 14:
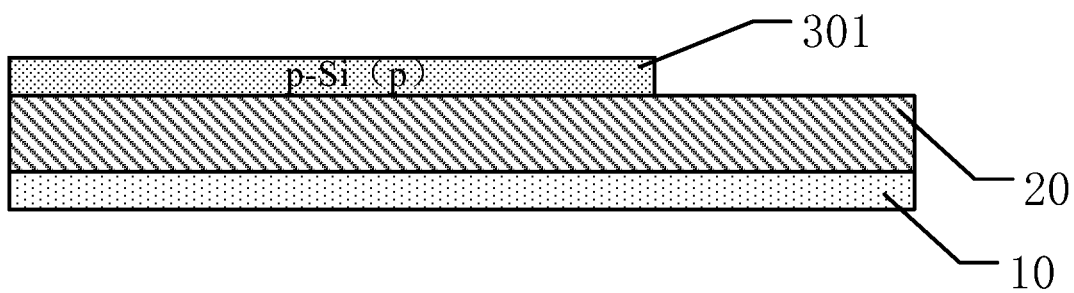

As shown in FIG. 14, the first film layer 30 may be patterned by the mask lithography to form the first portion 301 of the diode.

Figure 15:
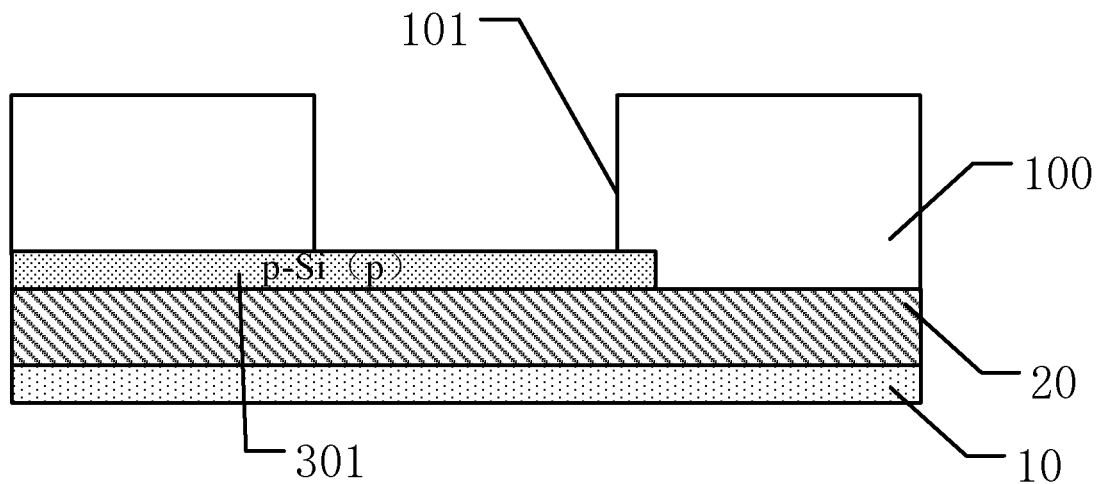

As shown in FIG. 15, after depositing the first insulation layer 100 (not filled in FIG. 15), the first via 101 may be formed by patterning the first insulation layer 100.

Figure 16:
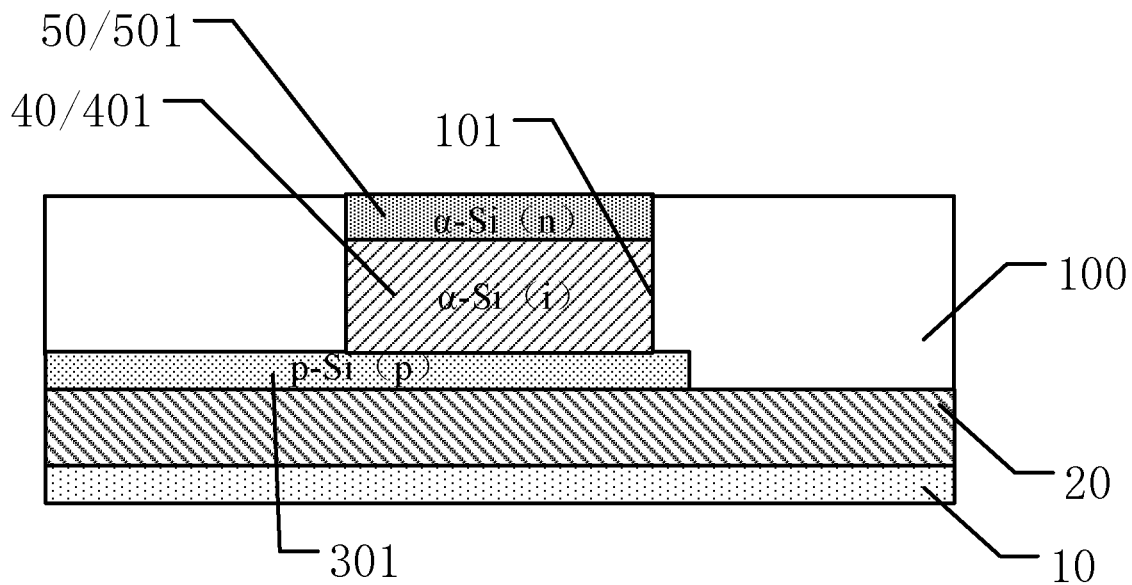

As shown in FIG. 16, after depositing one layer of the intrinsic amorphous silicon (e.g., i-type α-Si), a portion of the intrinsic amorphous silicon (e.g., i-type α-Si) may be used as the second film layer 40; the other portion of the intrinsic amorphous silicon (e.g., i-type α-Si) may be used to form the third film layer 50 of the N-type amorphous silicon (e.g., N-type α-Si) by doping with phosphorus ions or arsenic ions. The second film layer 40 may be patterned, and the second portion 401 of the diode may be formed in the first via 101; and the third film layer 50 may be patterned, and the third portion 501 of the diode may be formed in the first via 101. The third portion 501, the second portion 401, and the first portion 301 may be stacked over each other.

Figure 17:
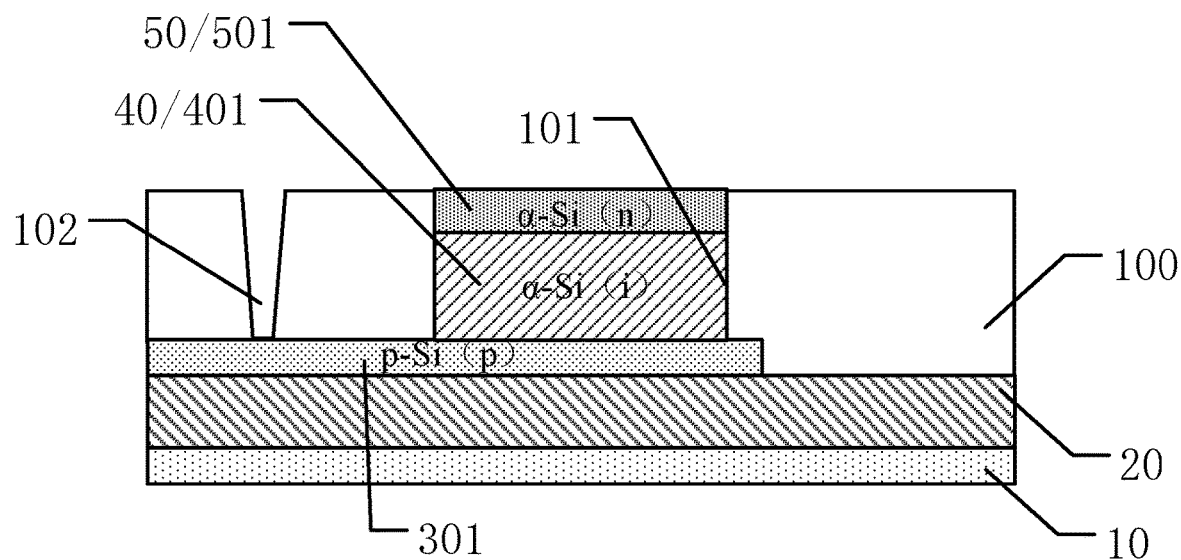

As shown in FIG. 17, the second via 102 may be formed by patterning the first insulation layer 100 for the second time.

Figure 18:
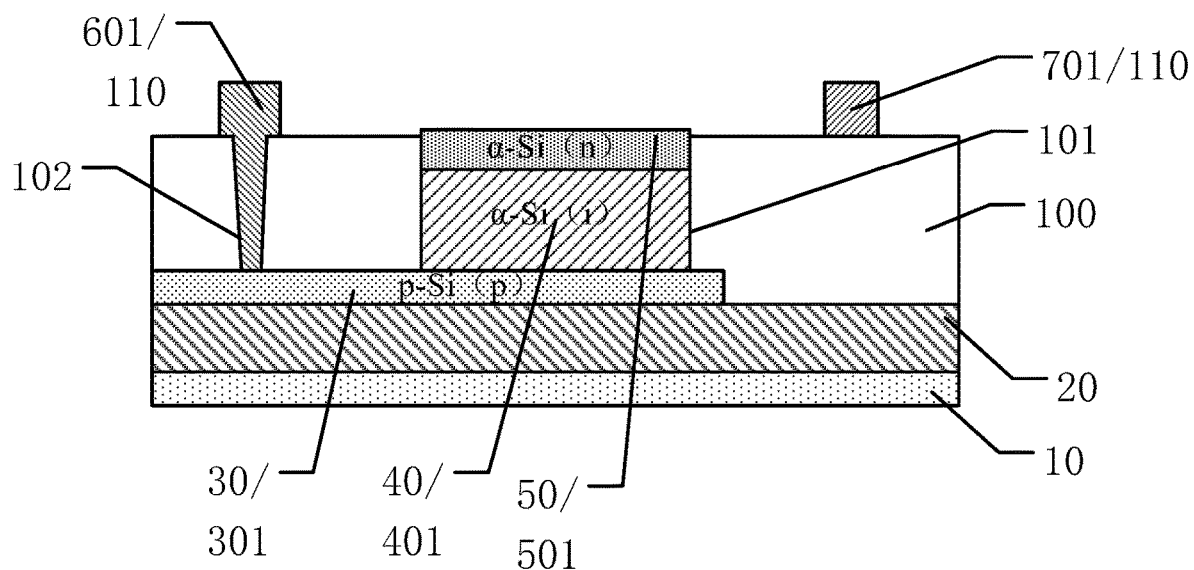

As shown in FIG. 18, after depositing one metal layer 110, the first electrode 601 and the second electrode 701 may be formed by patterning the metal layer 110, so that the first electrode 601 may be electrically connected to the first portion 301 through the second via 102, and the second electrode 701 may be electrically connected to the third portion 501.

In one embodiment, the fabrication method of the diode may be used to form the photodiode with the PIN structure (e.g., in FIG. 2 in the above-mentioned embodiments), where the first portion 301 may be made of polycrystalline silicon, the second portion 401 may be made of amorphous silicon and the third portion 501 may be made of amorphous silicon. The fabricated diode may have the beneficial effects in the above-mentioned embodiments, which may refer to the description of the diode in FIG. 2 according to the various embodiments of the present disclosure and may not be described in detail herein.

Optionally, in one embodiment, the method for fabricating the diode may also be described as the following (not shown in figures).

After depositing one buffer layer 20 and one layer of the intrinsic amorphous silicon (e.g., i-type α-Si) with a thickness of about 40 nm to about 60 nm on the substrate 10, the intrinsic amorphous silicon (e.g., i-type α-Si) may be converted to the intrinsic polycrystalline silicon (e.g., i-type p-Si) by the excimer laser crystallization (ELA) or the solid phase crystallization (SPC).

The first film layer 30 of N-type polycrystalline (N-type p-Si) may be formed from the intrinsic polycrystalline silicon (e.g., i-type p-Si) by doping phosphorus ions or arsenic ions.

The first film layer 30 may be patterned by the mask lithography to form the first portion 301 of the diode.

After depositing the first insulation layer 100, the first via 101 may be formed by patterning the first insulation layer 100.

After depositing one layer of the intrinsic amorphous silicon (e.g., i-type α-Si), a portion of the intrinsic amorphous silicon (e.g., i-type α-Si) may be used as the second film layer 40; another portion of the intrinsic amorphous silicon (e.g., i-type α-Si) may be doped with boron ions or indium ions to form the third film layer 50 of the P-type amorphous silicon (e.g., P-type α-Si) from the intrinsic amorphous silicon (e.g., i-type α-Si).

The second film layer 40 may be patterned, and the second portion 401 of the diode may be formed in the first via 101; and the third film layer 50 may be patterned, and the third portion 501 of the diode may be formed in the first via 101. The third portion 501, the second portion 401, and the first portion 301 may be stacked over each other.

The second via 102 may be formed by patterning the first insulation layer 100 for the second time.

After depositing one metal layer 110, the first electrode 601 and the second electrode 701 may be formed by patterning the metal layer 110, such that the first electrode 601 may be electrically connected to the first portion 301 through the second via 102, and the second electrode 701 may be electrically connected to the third portion 501.

In one embodiment, the fabrication method of the diode may be used to form the photodiode with the NIP structure (e.g., in FIG. 4 in the above-mentioned embodiments), where the first portion 301 may be made of polycrystalline silicon, the second portion 401 may be made of amorphous silicon and the third portion 501 may be made of amorphous silicon. The fabricated diode may have the beneficial effects in the above-mentioned embodiments, which may refer to the description of the diode in FIG. 4 according to the various embodiments of the present disclosure and may not be described in detail herein.

Optionally, in one embodiment, the method for fabricating the diode may also be described as the following (not shown in figures).

After depositing one buffer layer 20 and one layer of the intrinsic amorphous silicon (e.g., i-type α-Si) with a thickness of about 40 nm to about 60 nm on the substrate 10, the intrinsic amorphous silicon (e.g., i-type α-Si) may be converted to the intrinsic polycrystalline silicon (e.g., i-type p-Si) by the excimer laser crystallization (ELA) or the solid phase crystallization (SPC).

The first film layer 30 of P-type polycrystalline (P-type p-Si) may be formed from the intrinsic polycrystalline silicon (e.g., i-type p-Si) by doping boron ions or indium ions.

The first film layer 30 may be patterned by the mask lithography to form the first portion 301 of the diode.

After depositing the first insulation layer 100, the first via 101 may be formed by patterning the first insulation layer 100.

After depositing one layer of the intrinsic amorphous silicon (e.g., i-type α-Si), a portion of the intrinsic amorphous silicon (e.g., i-type α-Si) may be used as the second film layer 40; for another portion of the intrinsic amorphous silicon (e.g., i-type α-Si), the intrinsic amorphous silicon (e.g., i-type α-Si) may be first converted to the intrinsic polycrystalline silicon (i-type p-Si) by the excimer laser crystallization (ELA) or the solid phase crystallization (SPC), and then the intrinsic polycrystalline silicon (i-type p-Si) may be doped with phosphorus or arsenic ions to form the third film layer 50 of N-type polycrystalline silicon (e.g., N-type p-Si).

The second film layer 40 may be patterned, and the second portion 401 of the diode may be formed in the first via 101; and the third film layer 50 may be patterned, and the third portion 501 of the diode may be formed in the first via 101. The third portion 501, the second portion 401, and the first portion 301 may be stacked over each other.

The second via 102 may be formed by patterning the first insulation layer 100 for the second time.

After depositing one metal layer 110, the first electrode 601 and the second electrode 701 may be formed by patterning the metal layer 110, such that the first electrode 601 may be electrically connected to the first portion 301 through the second via 102, and the second electrode 701 may be electrically connected to the third portion 501.

In one embodiment, the fabrication method of the diode may be used to form the photodiode with the PIN structure (e.g., in FIG. 3 in the above-mentioned embodiments), where the first portion 301 may be made of polycrystalline silicon, the second portion 401 may be made of amorphous silicon and the third portion 501 may be made of polycrystalline silicon. The fabricated diode may have the beneficial effects in the above-mentioned embodiments, which may refer to the description of the diode in FIG. 3 according to the embodiments of the present disclosure and may not be described in detail herein.

Optionally, in one embodiment, the method for fabricating the diode may also be described as the following (not shown in figures).

After depositing one buffer layer 20 and one layer of the intrinsic amorphous silicon (e.g., i-type α-Si) with a thickness of about 40 nm to about 60 nm on the substrate 10, the intrinsic amorphous silicon (e.g., i-type α-Si) may be converted to the intrinsic polycrystalline silicon (e.g., i-type p-Si) by the excimer laser crystallization (ELA) or the solid phase crystallization (SPC).

The first film layer 30 of N-type polycrystalline (N-type p-Si) may be formed from the intrinsic polycrystalline silicon (e.g., i-type p-Si) by doping phosphorus ions or arsenic ions.

The first film layer 30 may be patterned by the mask lithography to form the first portion 301 of the diode.

After depositing the first insulation layer 100, the first via 101 may be formed by patterning the first insulation layer 100.

After depositing one layer of the intrinsic amorphous silicon (e.g., i-type α-Si), a portion of the intrinsic amorphous silicon (e.g., i-type α-Si) may be used as the second film layer 40; for another portion of the intrinsic amorphous silicon (e.g., i-type α-Si), the intrinsic amorphous silicon (e.g., i-type α-Si) may be first converted to the intrinsic polycrystalline silicon (i-type p-Si) by the excimer laser crystallization (ELA) or the solid phase crystallization (SPC), and then the intrinsic polycrystalline silicon (i-type p-Si) may be doped with boron ions or indium ions to form the third film layer 50 of P-type polycrystalline silicon (e.g., P-type p-Si).

The second film layer 40 may be patterned, and the second portion 401 of the diode may be formed in the first via 101; and the third film layer 50 may be patterned, and the third portion 501 of the diode may be formed in the first via 101. The third portion 501, the second portion 401, and the first portion 301 may be stacked over each other.

The second via 102 may be formed by patterning the first insulation layer 100 for the second time.

After depositing one metal layer 110, the first electrode 601 and the second electrode 701 may be formed by patterning the metal layer 110, such that the first electrode 601 may be electrically connected to the first portion 301 through the second via 102, and the second electrode 701 may be electrically connected to the third portion 501.

In one embodiment, the fabrication method of the diode may be used to form the photodiode with the NIP structure (e.g., in FIG. 5 in the above-mentioned embodiments), where the first portion 301 may be made of polycrystalline silicon, the second portion 401 may be made of amorphous silicon and the third portion 501 may be made of polycrystalline silicon. The fabricated diode may have the beneficial effects in the above-mentioned embodiments, which may refer to the description of the diode in FIG. 5 according to the embodiments of the present disclosure and may not be described in detail herein.

Figure 19:
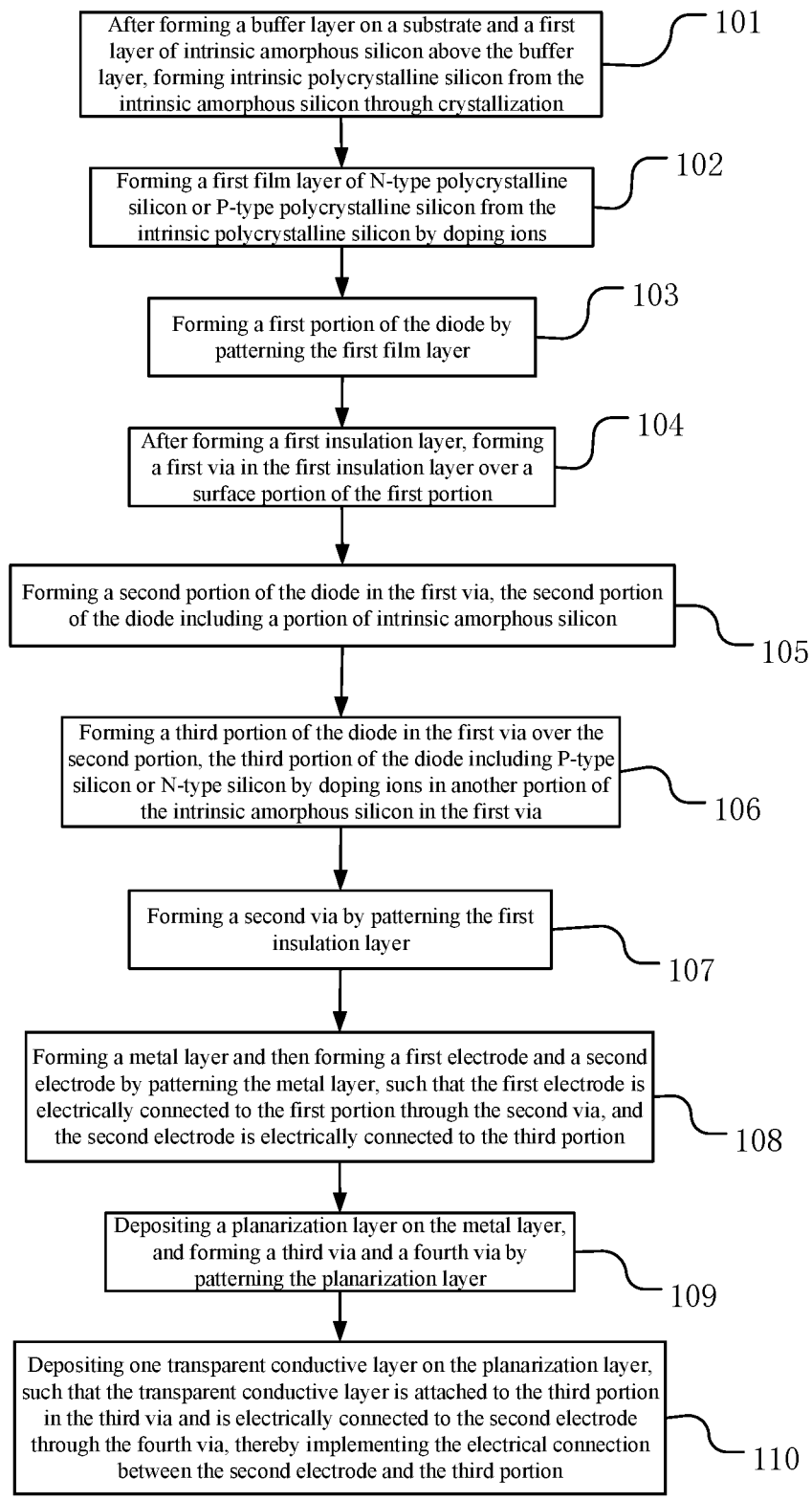
FIG. 19 illustrates a flow chart of a method for fabricating a diode according to embodiments of the present disclosure.
Figure 20:
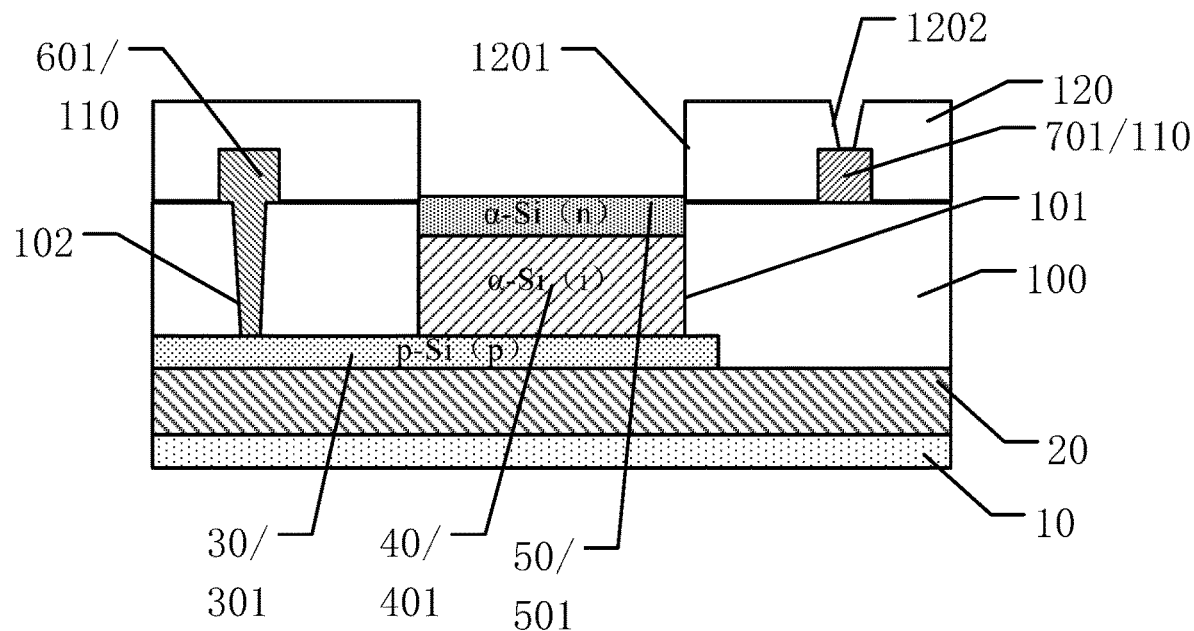
FIG. 20 illustrates a cross-sectional structural schematic of a step 109 in FIG. 19.
Figure 21:
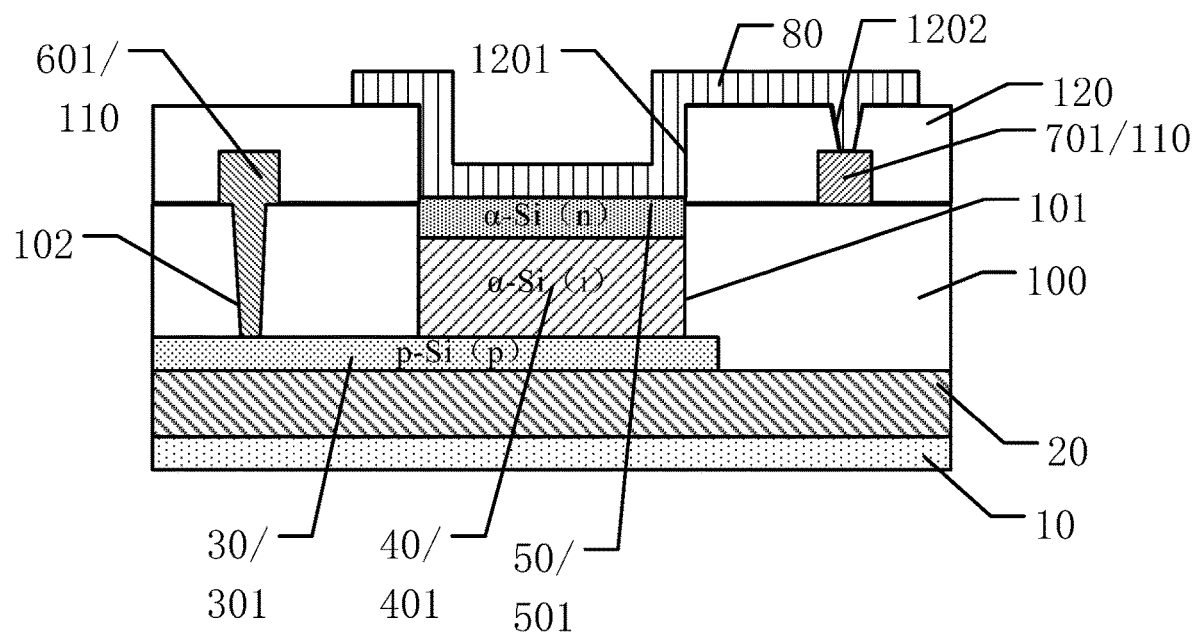
FIG. 21 illustrates a cross-sectional structural schematic of a step 110 in FIG. 19.

In some optional embodiments, referring to FIG. 19, FIG. 19 illustrates a flow chart of a method for fabricating a diode according to embodiments of the present disclosure. FIG. 20 illustrates a cross-sectional structural schematic of a step 109 in FIG. 19. FIG. 21 illustrates a cross-sectional structural schematic of a step 110 in FIG. 19. The method for fabricating the diode provided in one embodiment may further include:

step 109, depositing a planarization layer 120 on the metal layer 110, and forming a third via 1201 and a fourth via 1202 (shown in FIG. 20) by patterning the planarization layer 120; and step 110, depositing one transparent conductive layer 80 on the planarization layer 120, such that the transparent conductive layer 80 may be attached to the third portion 501 in the third via 1201 and may be electrically connected to the second electrode 701 through the fourth via 1202, thereby implementing the electrical connection between the second electrode 701 and the third portion 501 (shown in FIG. 21).

In one embodiment, the planarization layer 120 may be deposited on the metal layer 110, so the transparent conductive layer 80 may be insulated from the first electrode 601; furthermore, the transparent conductive layer 80 may be attached to the third portion 501, and may be electrically connected to the second electrode 701 through the fourth via 1202, thereby implementing the electrical connection between the second electrode 701 and the third portion 501. The transparent conductive layer 80 may transmit the photocurrent generated by the diode 000 due to illumination between the first electrode 601 and the second electrode 701 without affecting the amount of light sensed by the second portion 401 of the second film layer 40, thereby implementing the photo-sensing detection of the diode 000.

Figure 22:
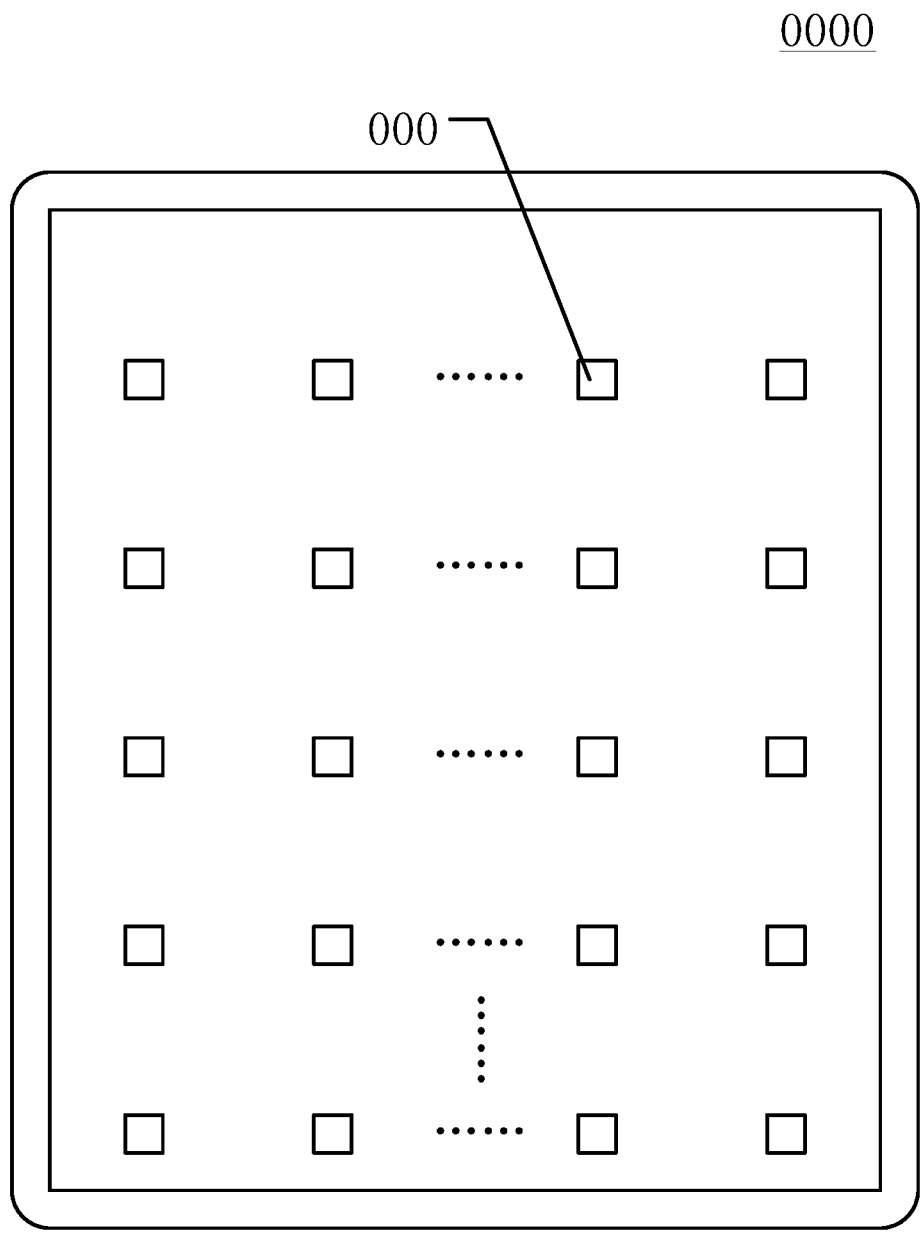
FIG. 22 illustrates a structural schematic of an array substrate according to embodiments of the present disclosure.

In some optional embodiments, referring to FIG. 22, FIG. 22 illustrates a structural schematic of an array substrate 0000 according to embodiments of the present disclosure. The array substrate 0000 provided in one embodiment may include the diode 000 provided in the embodiments of the present disclosure. Optionally, a plurality of the diodes 000 may be arranged in an array on the array substrate 0000. The array substrate 0000 provided in one embodiment may have the beneficial effects of the diode 000 provided by the above-mentioned embodiments, which may refer to the description of the diode according to the various embodiments of the present disclosure and may not be described in detail herein.

Figure 23:
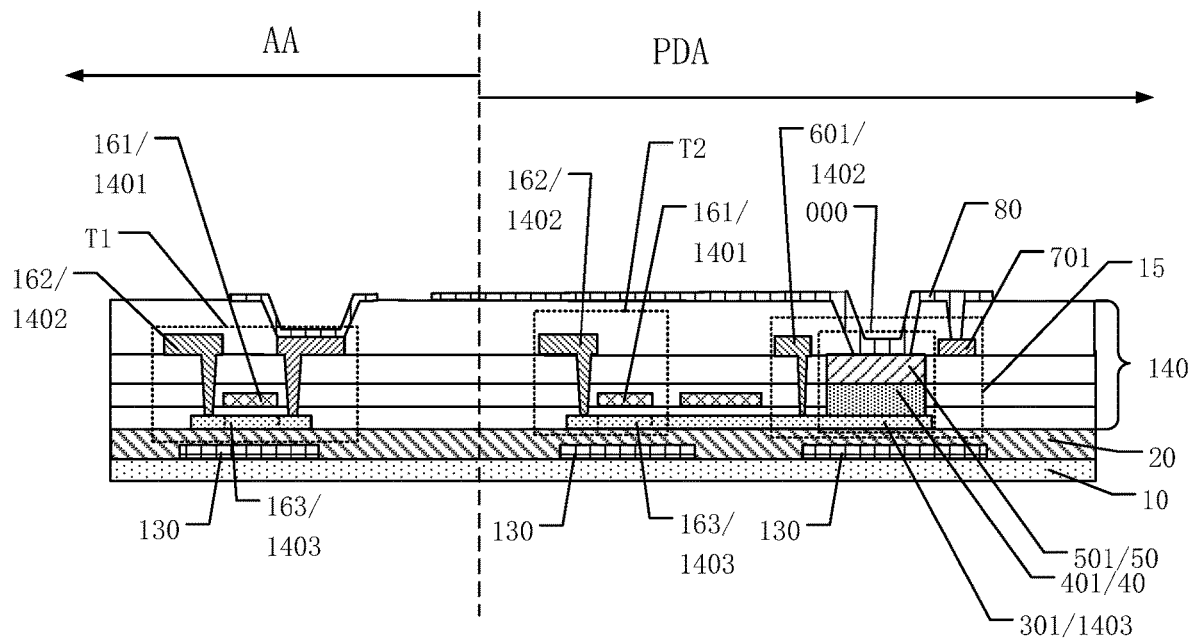
FIG. 23 illustrates a cross-sectional structural schematic of a partial region of an array substrate in FIG. 22.

In some optional embodiments, referring to FIG. 22 and FIG. 23, FIG. 23 illustrates a cross-sectional structural schematic of a partial region of an array substrate in FIG. 22 (the array substrate may include multiple structures, so FIG. 22 and FIG. 23 may only schematically illustrate a cross-sectional schematic of a partial region of the present technical solution, and the remaining structures of the array substrate may be understood according to the related structures in the existing technology, which may not be described in detail herein). In one embodiment, the array substrate 0000 may include a display area AA and a photoelectric detection area PDA and may further include a light-blocking layer 130 and an array layer 140. The light-blocking layer 130 may be between the substrate 10 and the array layer 140.

A plurality of thin-film display transistors T1 may be included within the range of the display area AA of the array layer 140. A plurality of thin-film switch transistors T2 and a plurality of fingerprint recognition units 15 may be included within the range of the photoelectric detection area PDA of the array layer 140.

The array layer 140 may include an active layer 1403, a gate electrode layer 1401, and a source/drain electrode layer 1402. Each of the thin-film display transistor T1 and the thin-film switch transistor T2 may include a gate electrode 161, a source/drain electrode 162, and a silicon island 163. The gate electrode 161 may be in the gate electrode layer 1401, the source/drain electrode 162 may be in the source/drain electrode layer 1402, and the silicon island 163 may be located in the active layer 1403.

Each fingerprint recognition unit 15 may include the diode 000, and the first portion 301 of the diode 000 may be configured in a same single layer as the silicon island 163.

The array substrate 0000 provided in one embodiment may include the display area AA and the photoelectric detection area PDA. The plurality of thin-film display transistors T1 may be included within the display area AA of the array layer 140, and may be used to implement the display function in the display area AA. The plurality of thin-film switch transistors T2 and the plurality of fingerprint recognition units 15 may be included within the range of the photoelectric detection area PDA of the array layer 140. The plurality of fingerprint recognition units 15 may be used for detecting the illuminous intensity, and the plurality of thin-film switch transistors T2 may be used as switch devices to control the photocurrent output. The fingerprint recognition unit 15 may include the diode 000 in the above-mentioned embodiments, so different photocurrents may be generated in the fingerprint recognition unit 15 under different illuminous intensities. When the thin-film switch transistor T2 is switched off, current signals may be transmitted to a drive chip (not shown in FIG. 23) on the array substrate 000 for processing, and then the corresponding illuminous intensities information may be acquired. In addition, the diode 000 in one embodiment may be formed by mixing and stacking polycrystalline silicon and amorphous silicon. The first portion 301 may be made of polycrystalline silicon, so the first portion 301 may be configured in a same single layer as the thin-film display transistor T1 at the display area AA and the thin-film switch transistor T2 at the photoelectric detection area PDA. That is, all of the first portion 301, the thin-film display transistor T1 at the display area AA and the thin-film switch transistor T2 at the photoelectric detection area PDA are configured in the active layer 1403, which may simplify the fabrication process; and it is not required to configure another film layer to fabricate the first portion 301 of the diode 000, which may improve the production efficiency.

It should be noted that, in one embodiment, the diode 000 merely including the first portion 301, the second portion 401 and the third portion 501 may be used as an example to illustratively describe the structure of the fingerprint recognition unit 15 in FIG. 23, and any other structures may also be included according to the embodiments of the present disclosure. When the diode 000 has other structures in the above-mentioned embodiments, the cross-sectional schematic of the array substrate 0000 may be drawn according to the drawings of the above-mentioned embodiments, which may not be described in detail herein.

Figure 24:
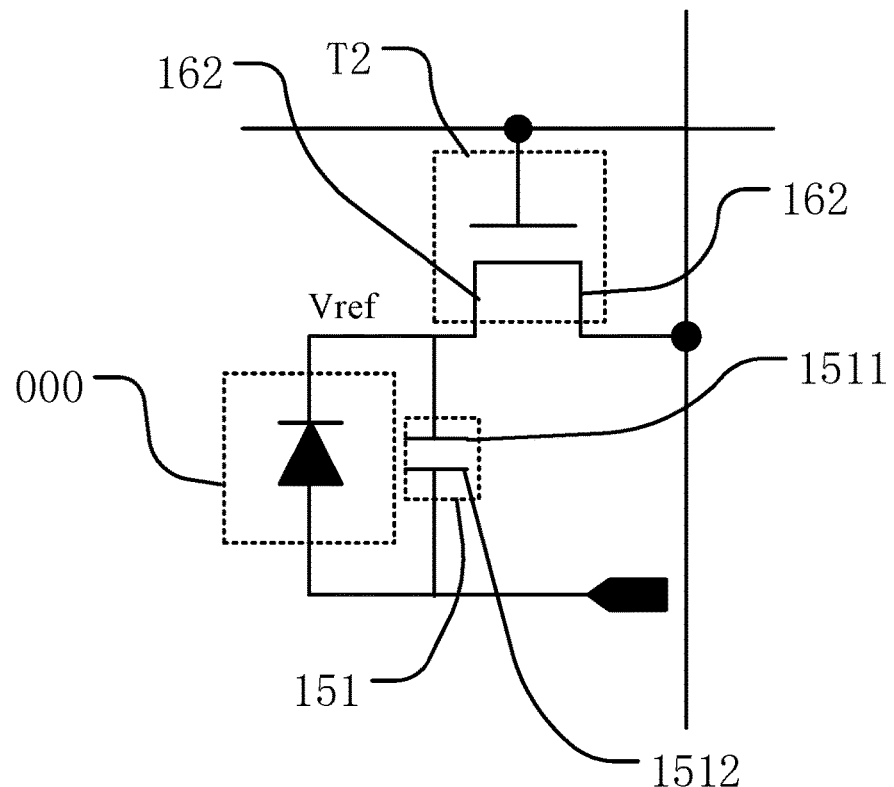
FIG. 24 illustrates a principle schematic of an equivalent circuit of a fingerprint recognition unit according to embodiments of the present disclosure.
Figure 25:
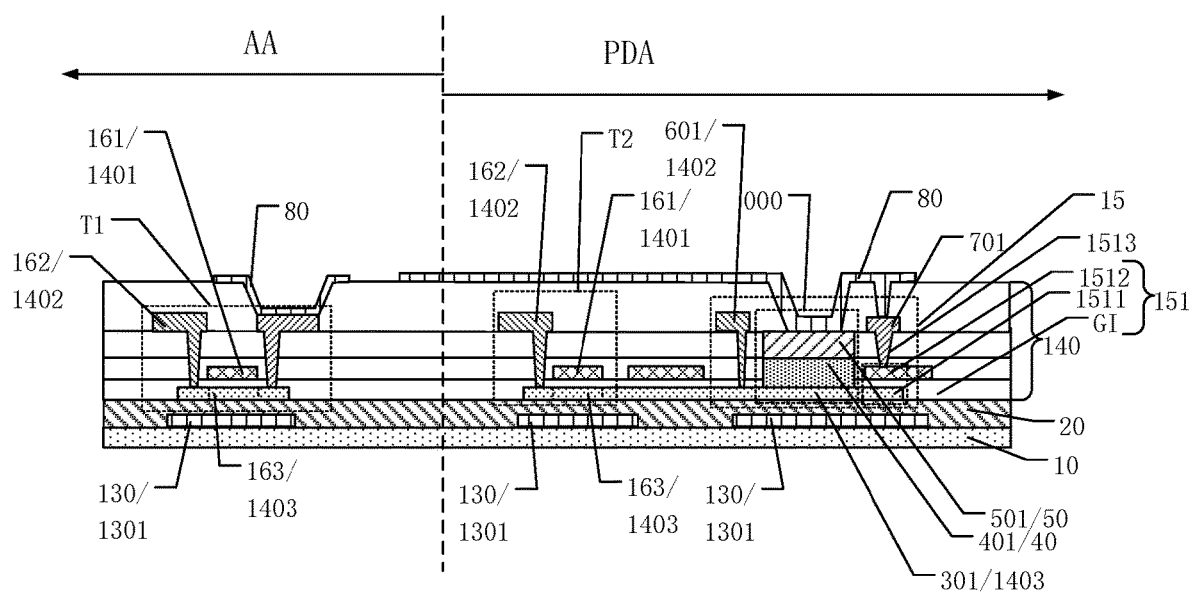
FIG. 25 illustrates another cross-sectional structural schematic of a partial region of an array substrate in FIG. 22.

In some optional embodiments, referring to FIG. 24 and FIG. 25, FIG. 24 illustrates a principle schematic of an equivalent circuit of a fingerprint recognition unit according to embodiments of the present disclosure; and FIG. 25 illustrates another cross-sectional structural schematic of a partial region of an array substrate in FIG. 22. In one embodiment, each fingerprint recognition unit 15 may further include a storage capacitor 151 including a third electrode 1511 and a fourth electrode 1512. The third electrode 1511 may be configured at a same single layer as the first portion 301, and the fourth electrode 1512 may be configured in a same single layer as the gate 161.

In one embodiment, it may further illustrate that the optional equivalent circuit structure of the fingerprint recognition unit may further include the storage capacitor 151.

When performing photo-sensing by the fingerprint recognition unit 15, the storage capacitor 151 may form a discharge loop with the photodiode 000 to obtain the corresponding photo-sensing signals. For example, the storage capacitor 151 may be disposed in parallel with the photodiode 000, that is, the third electrode 1511 of the storage capacitor 151 may be electrically connected to the cathode of the photodiode 000, and the fourth electrode 1512 may be electrically connected to the anode of the photodiode 000. When the reference voltage Vref is transmitted to the cathode of the photodiode 000, the storage capacitor 151 may also be charged. When the thin-film switch transistor T2 is switched off, the storage capacitor 151 may form a discharge loop with the photodiode 000, and the voltage of the third electrode 1511, which may be connected to the photodiode 000, of the storage capacitor 151 may be gradually decreased. By setting the storage capacitor 151, the capacitance of the fingerprint recognition unit 15 may be increased, thereby reducing the voltage drop speed on the cathode of the photodiode 000, which may obtain the effective photo-sensing signals and improve the photo-sensing precision. Furthermore, in one embodiment, the third electrode 1511 of the storage capacitor 151 may be configured in a same single layer as the first portion 301, and the fourth electrode 1512 may be configured in a same single layer as the gate 161, so the first portion 301 made of polycrystalline silicon, the gate insulation (GI) layer, and the gate 161 may be stacked to form the storage capacitor 151 of the fingerprint recognition unit 15; in addition, it is not required to configure another film layer to fabricate the third electrode 1511 and the fourth electrode 1512 of the storage capacitor 151, which may simplify the fabrication process and improve the production efficiency.

In some optional embodiments, referring to FIG. 14 and FIG. 25, the fourth electrode 1512 may be electrically connected to the transparent conductive layer 80 through a via 1513.

In one embodiment, it may further illustrate that the transparent conductive layer 80 may be disposed on the side of the third portion 501 of the diode 000 away from the substrate 10, and the fourth electrode 1512 of the storage capacitor 151 may be electrically connected to the transparent conductive layer 80 through the via 1513. The transparent conductive layer 80 may be configured to connect a common potential signal, thereby providing a voltage signal of a DC (direct current) quiescent operating point for the storage capacitor 151 and the anode of the diode 000. The common potential signal connected to the anode of the diode 000 may refer to a preset DC voltage without the photocurrent. The common potential signal of the diode 000 may be reverse biased, that is, no current may pass the diode without illumination. When the light enters the diode 000, a portion of carriers may cross the barrier formed by the reverse bias to generate the photocurrent, and the magnitude of the photocurrent may be proportional to the illuminous intensity. The magnitude of the common potential signal may also be configured according to the actual requirements; but may be greater than the forward voltage of the diode 000 and greatly less than the reverse breakdown voltage.

It should be noted that the material of the transparent conductive layer 80 may not be limited according to the embodiments of the present disclosure, which may be any of indium tin oxides (ITO) or antimony doped tin dioxide (ATO). The material of the transparent conductive layer 80 may also be other suitable transparent conductive material(s) which may be required to make the transparent conductive layer to be conductive and transparent, and the details may not be described in detail herein.

It should be further noted that, in one embodiment, the transparent conductive layer 80 may be electrically connected to the drain electrode of the thin-film display transistor T1 through the via in the display area AA, and may be used to as a pixel electrode in the display area AA to control the applied voltage signal of liquid crystals in the display area AA, where the implementation principle may not be described in detail herein, and may be understood by referring to the display principle of the liquid crystal display panel in the existing technology.

In some optional embodiments, referring to FIG. 25, the light-blocking layer 130 may include a plurality of light-blocking portions 1301, and orthographic projections of the silicon islands 163 and the first portion 301 on the substrate 10 may be within orthographic projections of the light-blocking portions 1301 on the substrate 10, respectively.

In one embodiment, it may further illustrate that the light-blocking layer 130 may include the plurality of light-blocking portions 1301, and may further define that the orthographic projections of the silicon islands 163 and the first portion 301 on the substrate 10 may be within the orthographic projections of the light-blocking portions 1301 on the substrate 10, respectively. That is, the orthographic projection of the light-blocking portions 1301 on the substrate 10 may be required to cover the orthographic projections of the silicon islands 163 on the substrate 10, so the light-blocking portions 1301 may block the external light illumination on the silicon islands 163, thereby preventing the leakage current caused the external light from affecting the silicon island 163 of the thin-film display transistor T1 and the silicon island 163 of the thin-film switch transistor T2. Furthermore, the orthographic projection of the light-blocking portions 1301 on the substrate 10 may be also required to cover the orthographic projection of the first portion 301 on the substrate 10, so the light-blocking portions 1301 may block the light emitting from the structure on the side of the substrate 10 away from the first portions 301 of the diode 000 (optionally, the structure on the side of substrate 10 away from the first portions 301 of the diode 000 may include a backlight module, not shown in FIG. 25) to the fingerprint recognition unit 15, thereby preventing the light, generated from the structure on the side of the substrate 10 away from the first portions 301 of the diode 000, from affecting the optical signal recognition of the fingerprint recognition unit 15. In such way, the recognition sensitivity of the fingerprint recognition unit 15 may be improved, which may further improve the fingerprint recognition effect of the display panel.

Figure 26:
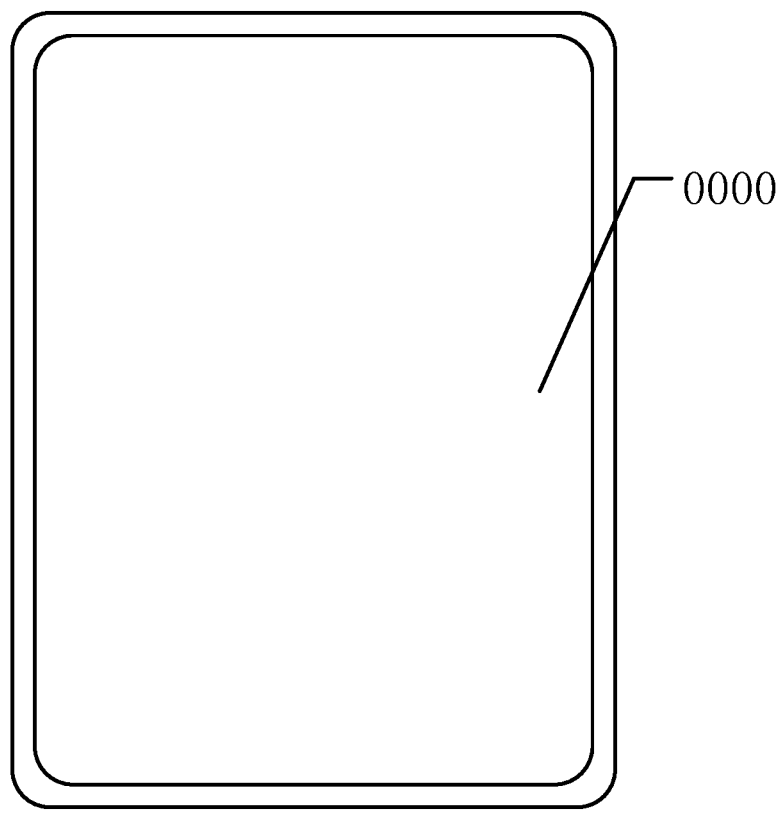
FIG. 26 illustrates a structural schematic of an exemplary display device according to the present disclosure.

In some optional embodiments, referring to FIG. 26, FIG. 26 illustrates a structural schematic of the exemplary display device 1111 according to the present disclosure. The display panel provided in one embodiment may include the array substrate 0000 in the above-mentioned embodiments. In one embodiment, a mobile phone may be used as an example to illustrate the display panel 1111 in FIG. 26. It should be understood that the display panel 1111 provided by the embodiments of the present disclosure may be a display panel of a display device having a display function, where the display device may be a computer, a television, an electronic paper, an in-vehicle display device, and the like, which may not be limited according to the embodiments of the present disclosure. The display panel 1111 provided in one embodiment may have the beneficial effects of the array substrate 0000 provided by the embodiments of the present disclosure, which may refer to the description of the array substrate 000 according to the various embodiments of the present disclosure and may not be described in detail herein.

From the above-mentioned embodiments, it can be seen that the diode and its fabrication method, the array substrate, and the display panel provided by the present disclosure may achieve at least the following beneficial effects.

For the stacked photodiode structure fabricated by the LTPS process in the present disclosure, the first portion may be made of polycrystalline silicon, the second portion may be made of amorphous silicon, and the third portion may be made of polycrystalline silicon or amorphous silicon, thereby forming the photodiode structure by mixing and stacking polycrystalline silicon or amorphous silicon. The first portion may be used as the portion of the PIN structure, and also be used as the conductive layer to lead out the photogenerated charges from the photodiode during the illumination, thereby implementing the photo-sensing detection by detecting the led-out photogenerated charges and simplifying the fabrication process. The stacked photodiode structure fabricated by the LTPS process in the present disclosure may make the diode to have desirable diode characteristics, which may ensure the light absorption by the diode; in addition, the stacked structure may be utilized to fabricate the PIN structure of the diode with the enough thickness to sufficiently absorb the light entering the diode, which may increase the luminous flux without a strong light source, increase the photosensitivity of the diode and further reduce the power consumption of the light source. The first portion of the diode in the present disclosure may be made of polycrystalline silicon. Therefore, in the array substrate fabricated by the diode, the first portion may be configured at the same single layer as the thin-film display transistor at the display area and the thin-film switch transistor at the photoelectric detection area, which may simplify the fabrication process and improve the production efficiency.

The details of the present disclosure have been described through the embodiments provided above. However, those skilled in the art should understand that the disclosed embodiments are exemplary only and are not intended to limit the scope of the present disclosure. Those skilled in the art should understand that the disclosed embodiments can be modified according to the scope and principles of the present disclosure. The scope of the present disclosure is defined by the appended claims and their equivalents.

What is claimed is:

1. A diode, comprising:
a substrate, a buffer layer on a side of the substrate, and a first film layer, a second film layer, a third film layer, and a fourth film layer, which are configured at a side of the buffer layer away from the substrate, wherein:
the second film layer is located at a side of the first film layer away from the buffer layer, and the third film layer is located at a side of the second film layer away from the buffer layer;
the first film layer is a polycrystalline silicon film layer; the second film layer is an amorphous silicon film layer; and the third film layer is one of the polycrystalline silicon film layer and the amorphous silicon film layer;
the fourth film layer is configured between the first film layer and the second film layer, and has a same conductivity as the first film layer adjacent to the fourth film; and
the diode at least includes a first portion, a second portion, a third portion, a first electrode, and a second electrode, wherein:
the first portion is located in the first film layer; the second portion is located in the second film layer; and the third portion is located in the third film layer; and
the first electrode is located at a side of the first portion away from the buffer layer and is electrically connected to the first portion; and the second electrode is located at a side of the third portion away from the buffer layer and is electrically connected to the third portion.

2. The diode according to claim 1, wherein:
the first film layer is P-type polycrystalline silicon; the second film layer is intrinsic amorphous silicon; and the third film layer is one of N-type amorphous silicon and N-type polycrystalline silicon.

3. The diode according to claim 1, wherein:
the first film layer is N-type polycrystalline silicon; the second film layer is intrinsic amorphous silicon; and the third film layer is one of P-type amorphous silicon and P-type polycrystalline silicon.

4. The diode according to claim 1, wherein:
the fourth film layer is an amorphous silicon film layer; and
the diode further includes a fourth portion located in the fourth film layer.

5. The diode according to claim 1, wherein:
the fourth film layer is one of N-type amorphous silicon and P-type amorphous silicon.

6. The diode according to claim 1, wherein:
a transparent conductive layer is located at a side of the third film layer away from the substrate, and the third portion is electrically connected to the second electrode through the transparent conductive layer.

7. A method for fabricating a diode, comprising:
after forming a buffer layer on a substrate and a first layer of intrinsic amorphous silicon above the buffer layer, forming intrinsic polycrystalline silicon from the intrinsic amorphous silicon through crystallization;
forming a first film layer of N-type polycrystalline silicon or P-type polycrystalline silicon from the intrinsic polycrystalline silicon by doping ions;
forming a first portion of the diode by patterning the first film layer;
after forming a first insulation layer, forming a first via in the first insulation layer over a surface portion of the first portion;
forming a second portion of the diode in the first via, the second portion of the diode including a portion of intrinsic amorphous silicon;
forming a third portion of the diode in the first via over the second portion, the third portion of the diode including P-type silicon or N-type silicon by doping ions in another portion of the intrinsic amorphous silicon in the first via;
forming a fourth portion between the first portion and the second portion, wherein the fourth portion has a same conductivity as the first portion that is adjacent to the fourth portion;
forming a second via by patterning the first insulation layer; and
forming a metal layer and then forming a first electrode and a second electrode by patterning the metal layer, such that the first electrode is electrically connected to the first portion through the second via, and the second electrode is electrically connected to the third portion.

8. The method according to claim 7, wherein:
the P-type silicon includes P-type amorphous silicon; and the N-type silicon includes N-type amorphous silicon.

9. The method according to claim 8, wherein forming the second portion of the diode in the first via and forming the third portion of the diode in the first via over the second portion include:
   forming a silicon layer of intrinsic amorphous silicon on the first insulation layer and in the first via;
   doping an upper portion of the intrinsic amorphous silicon with P-type ions or N-type ions; and
   removing a portion of the silicon layer on the first insulation layer to expose the first insulation layer, thereby forming the third portion including the P-type amorphous silicon or the N-type amorphous silicon over the second portion including a remaining intrinsic amorphous silicon, in the first via.

10. The method according to claim 7, wherein:
    the P-type silicon includes P-type polycrystalline silicon; and
    the N-type silicon includes N-type polycrystalline silicon.

11. The method according to claim 10, wherein forming the second portion of the diode in the first via and forming the third portion of the diode in the first via over the second portion include:
    forming a silicon layer of intrinsic amorphous silicon on the first insulation layer and in the first via;
    crystallizing an upper portion of the intrinsic amorphous silicon to form an intrinsic polycrystalline silicon and doping the intrinsic polycrystalline silicon with P-type ions or N-type ions; and
    removing a portion of the silicon layer on the first insulation layer to expose the first insulation layer, thereby forming the third portion including the P-type polycrystalline silicon or the N-type polycrystalline silicon over the second portion including a remaining intrinsic amorphous silicon, in the first via.

12. An array substrate, comprising:
    a diode, comprising:
       a substrate, a buffer layer on a side of the substrate, and a first film layer, a second film layer, a third film layer, and a fourth film layer, which are configured at a side of the buffer layer away from the substrate, wherein:
          the second film layer is located at a side of the first film layer away from the buffer layer, and the third film layer is located at a side of the second film layer away from the buffer layer;
          the first film layer is a polycrystalline silicon film layer; the second film layer is an amorphous silicon film layer; the third film layer is one of the polycrystalline silicon film layer and the amorphous silicon film layer;
          the fourth film layer is configured between the first film layer and the second film layer, and has a same conductivity as the first film layer adjacent to the fourth film; and
       the diode at least includes a first portion, a second portion, a third portion, a first electrode, and a second electrode, wherein:
          the first portion is located in the first film layer; the second portion is located in the second film layer; and the third portion is located in the third film layer; and
          the first electrode is located at a side of the first portion away from the buffer layer and is electrically connected to the first portion; and the second electrode is located at a side of the third portion away from the buffer layer and is electrically connected to the third portion.

13. The array substrate according to claim 12, wherein:
    the array substrate includes a display area, a photoelectric detection area, an array layer, and a light-blocking layer between the substrate and the array layer; wherein:
       a plurality of thin-film display transistors is included within a range of the display area of the array layer, and a plurality of thin-film switch transistors and a plurality of fingerprint recognition units are included within a range of the photoelectric detection area of the array layer;
    the array layer includes an active layer, a gate electrode layer, and a source/drain electrode layer; each of the thin-film display transistor and the thin-film switch transistor includes a gate electrode, a source/drain electrode, and a silicon island; the gate electrode is in the gate electrode layer, the source/drain electrode is in the source/drain electrode layer, and the silicon island is in the active layer; and
    each fingerprint recognition unit includes the diode, and the first portion of the diode is configured in a same single layer as the silicon island.

14. The array substrate according to claim 13, wherein:
    each fingerprint recognition unit further includes a storage capacitor including a third electrode and a fourth electrode, wherein the third electrode is configured in a same single layer as the first portion, and the fourth electrode is configured in a same single layer as the gate electrode.

15. The array substrate according to claim 14, wherein:
    the fourth electrode is electrically connected to a transparent conductive layer through a via.

16. The array substrate according to claim 13, wherein:
    the light-blocking layer includes a plurality of light-blocking portions, and orthographic projections of the silicon island and the first portion on the substrate are within orthographic projections of the light-blocking portions on the substrate, respectively.

17. A display panel, comprising:
    an array substrate, comprising:
    a diode, comprising:
       a substrate, a buffer layer on a side of the substrate, and a first film layer, a second film layer, a third film layer, and a fourth film layer, which are configured at a side of the buffer layer away from the substrate, wherein:
          the second film layer is located at a side of the first film layer away from the buffer layer, and the third film layer is located at a side of the second film layer away from the buffer layer; and
          the first film layer is a polycrystalline silicon film layer; the second film layer is an amorphous silicon film layer; the third film layer is one of the polycrystalline silicon film layer and the amorphous silicon film layer;
          the fourth film layer is configured between the first film layer and the second film layer, and has a same conductivity as the first film layer adjacent to the fourth film; and
       the diode at least includes a first portion, a second portion, a third portion, a first electrode, and a second electrode, wherein:
          the first portion is located in the first film layer; the second portion is located in the second film layer; and the third portion is located in the third film layer; and the first electrode is located at a side of the first portion away from the buffer layer and is electrically connected to the first portion; and the second electrode is located at a side of the third portion away from the buffer layer and is electrically connected to the third portion.

\* \* \* \* \*